(12) United States Patent
Fusella et al.

(10) Patent No.: US 12,082,428 B2
(45) Date of Patent: Sep. 3, 2024

(54) OLED WITH TRIPLET EMITTER AND EXCITED STATE LIFETIME LESS THAN 200 ns

(71) Applicant: Universal Display Corporation, Ewing, NJ (US)

(72) Inventors: Michael Fusella, Lawrenceville, NJ (US); Nicholas J. Thompson, New Hope, PA (US); Julia J. Brown, Yardley, PA (US); Michael Stuart Weaver, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 660 days.

(21) Appl. No.: 16/814,504

(22) Filed: Mar. 10, 2020

(65) Prior Publication Data

US 2020/0295291 A1 Sep. 17, 2020

Related U.S. Application Data

(60) Provisional application No. 62/817,389, filed on Mar. 12, 2019.

(51) Int. Cl.
*H01L 51/50* (2006.01)
*C09K 11/06* (2006.01)
(Continued)

(52) U.S. Cl.
CPC ............ *H10K 50/11* (2023.02); *C09K 11/06* (2013.01); *H10K 85/342* (2023.02);
(Continued)

(58) Field of Classification Search
CPC ............. H01L 51/5016; H01L 51/0085; H01L 51/0086; H01L 51/0087; H01L 51/0088; H01L 51/0091; H01L 2251/5369; H01L 51/5203; H01L 2251/55; H01L 51/5012; H01L 51/0077; C09K 11/06; C09K 2211/185; C09K 2211/188; H10K 50/11; H10K 85/342; H10K 85/344; H10K 85/346; H10K 85/348; H10K 85/371;
(Continued)

(56) References Cited

U.S. PATENT DOCUMENTS 4,769,292 A 9/1988 Tang
5,247,190 A 9/1993 Friend
(Continued)

FOREIGN PATENT DOCUMENTS

CN 104716273 A 6/2015
CN 106663740 A 5/2017
(Continued)

OTHER PUBLICATIONS

Baldo et al. Highly efficient phosphorescent emission from organic electroluminescent devices, Nature, vol. 395, pp. 151-154, 1998.
(Continued)

*Primary Examiner* — Ermias T Woldegeorgis
(74) *Attorney, Agent, or Firm* — Butzel Long

(57) ABSTRACT

Emissive devices are provided that include a phosphorescent emitter placed within a threshold distance of an enhancement layer to achieve transient lifetimes of 200 ns or less.

20 Claims, 4 Drawing Sheets

(51) Int. Cl.
*H10K 50/11* (2023.01)
*H10K 85/30* (2023.01)
*H10K 101/10* (2023.01)

(52) U.S. Cl.
CPC ......... *H10K 85/344* (2023.02); *H10K 85/346* (2023.02); *H10K 85/348* (2023.02); *H10K 85/371* (2023.02); *C09K 2211/185* (2013.01); *C09K 2211/188* (2013.01); *H10K 2101/10* (2023.02)

(58) Field of Classification Search
CPC ........... H10K 2101/10; H10K 2101/00; H10K 2102/331; H10K 50/805; H10K 85/30
See application file for complete search history.

(56) References Cited

U.S. PATENT DOCUMENTS

| | | | |
|---|---|---|---|
| 5,703,436 | A | 12/1997 | Forrest |
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,310,360 | B1 * | 10/2001 | Forrest ............... H10K 50/11 257/89 |
| 6,337,102 | B1 | 1/2002 | Forrest |
| 6,468,819 | B1 | 10/2002 | Kim |
| 7,279,704 | B2 * | 10/2007 | Walters ............ H05B 33/14 257/40 |
| 7,431,968 | B1 | 10/2008 | Shtein |
| 7,968,146 | B2 | 6/2011 | Wagner |
| 9,960,386 | B2 | 5/2018 | Thompson |
| 2003/0230980 | A1 | 12/2003 | Forrest |
| 2004/0174116 | A1 | 9/2004 | Lu |
| 2005/0260449 | A1 | 11/2005 | Walters |
| 2017/0133631 | A1 * | 5/2017 | Thompson .......... H10K 50/131 |
| 2017/0229663 | A1 | 8/2017 | Tsai |
| 2017/0338289 | A1 * | 11/2017 | Seo ....................... H10K 59/88 |

FOREIGN PATENT DOCUMENTS

| | | | | |
|---|---|---|---|---|
| CN | 109037462 | A | | 12/2018 |
| KR | 20170036051 | A | | 3/2017 |
| WO | WO-03103341 | A1 * | 12/2003 | ......... H01L 51/5016 |
| WO | 2008057394 | A1 | | 5/2008 |
| WO | 2010011390 | A2 | | 1/2010 |
| WO | WO-2011076326 | A1 * | 6/2011 | ............ C09K 11/06 |
| WO | 2016014983 | A1 | | 1/2016 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Extended European Search Report for App. No. EP20162529.0, mailing date Jul. 27, 2020, 9 pages.

Minghang Li et al., "High efficiency electrophosphorescence from bilayer organic light emitting diodes;High efficiency electrophosphorescence from bilayer organic light emitting diodes", Journal of Physics D: Applied Physics, Institute of Physics Publishing Ltd, GB, vol. 44, No. 36, Aug. 23, 2011 (Aug. 23, 2011), p. 365103, XP020209611, ISSN: 0022-3727, DO[; 10.1088/0022-3727/44/36/365103.

Monima Sarma et al., "Anomalously Long-Lasting Blue PhOLED Featuring Phenyl-Pyrimidine Cyclometalated Iridium Emitter", CHEM, vol. 3, No. 3, Sep. 1, 2017 (Sep. 1, 2017), pp. 461-476, XP055711511, US ISSN: 2451-9294, DOI 10.1016/j.chempr.2017.08.001.

Chinese Office Action issued in App. No. CN202010172165, dated Jan. 30, 2024, 8 pages.

Korean Office Action (including English translation) issued in App. No. KR1020200030750, dated Dec. 1, 2023, 8 pages.

* cited by examiner

OLED WITH TRIPLET EMITTER AND EXCITED STATE LIFETIME LESS THAN 200 ns

CROSS-REFERENCE TO RELATED APPLICATIONS

This application is a non-provisional, and claims the priority benefit, of U.S. Patent Application Ser. No. 62/817,389, filed Mar. 12, 2019, the entire contents of which are incorporated herein by reference.

FIELD

The present invention relates to structures and arrangements for use in devices such as organic light emitting diodes, and devices including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
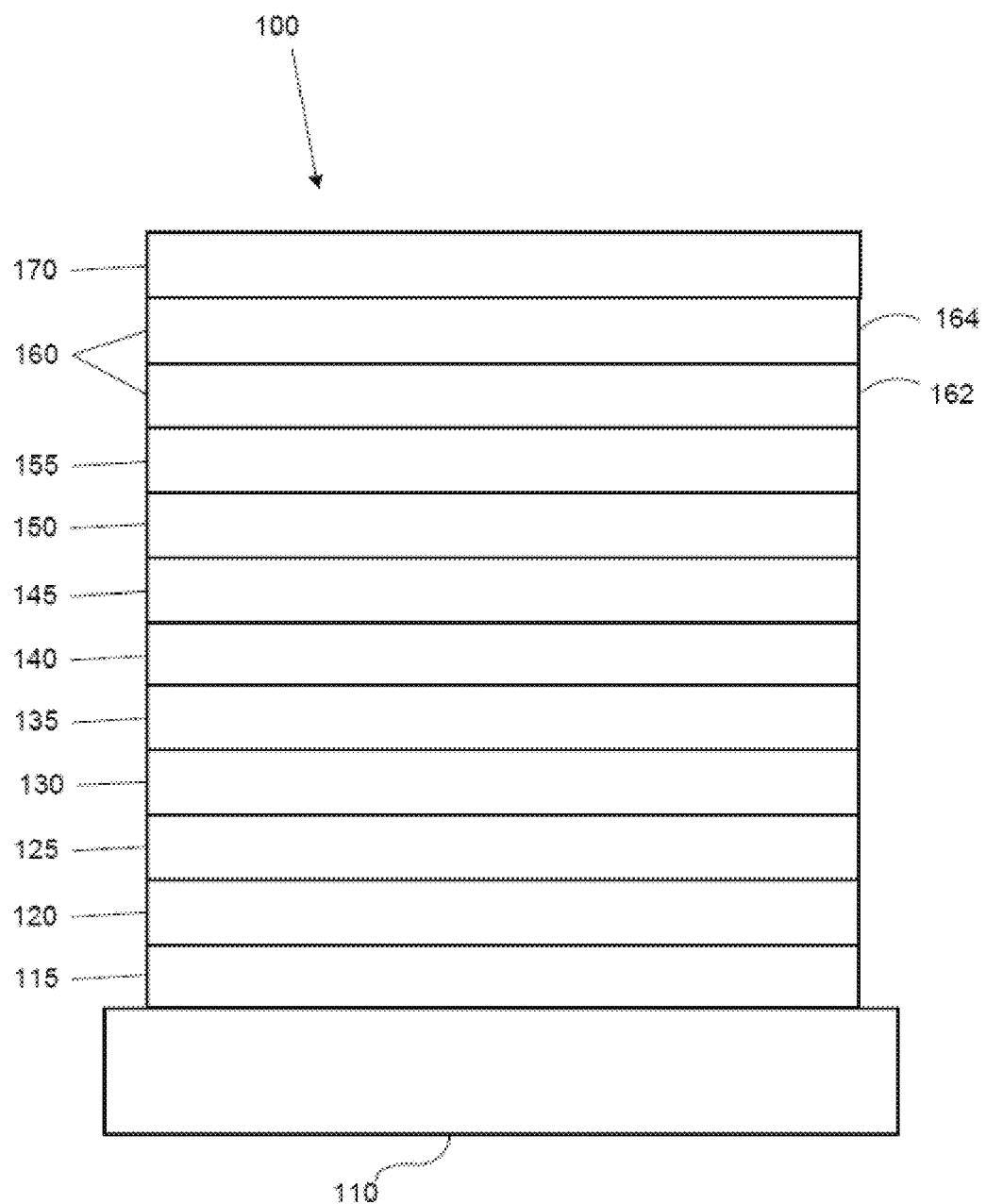
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
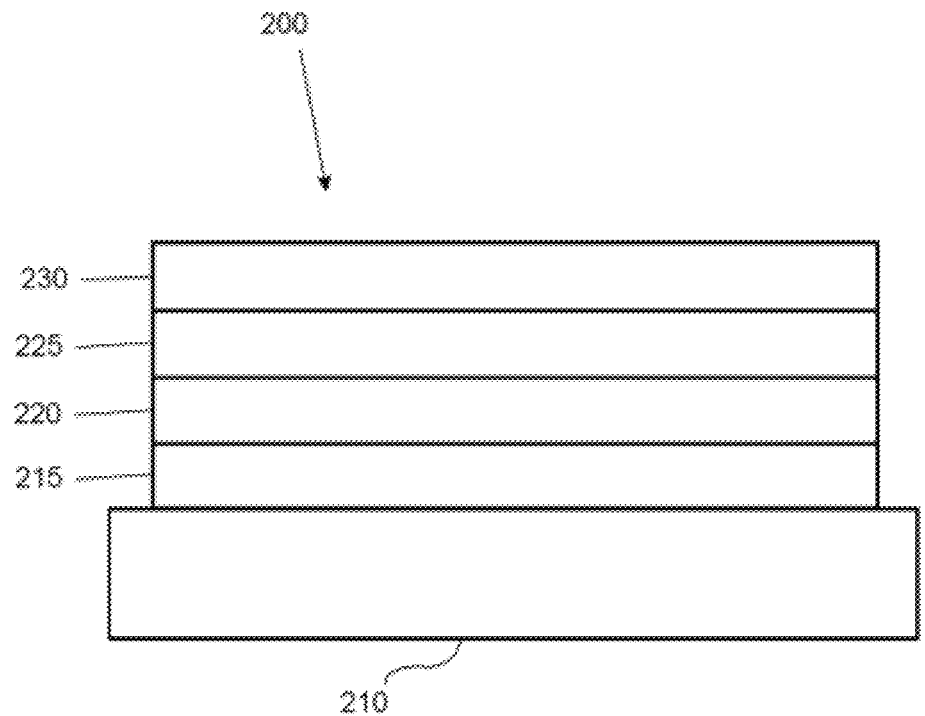
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used.

Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

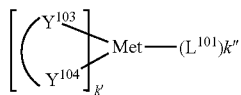

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

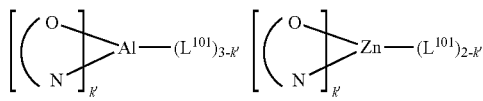

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

In one aspect, the host compound contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

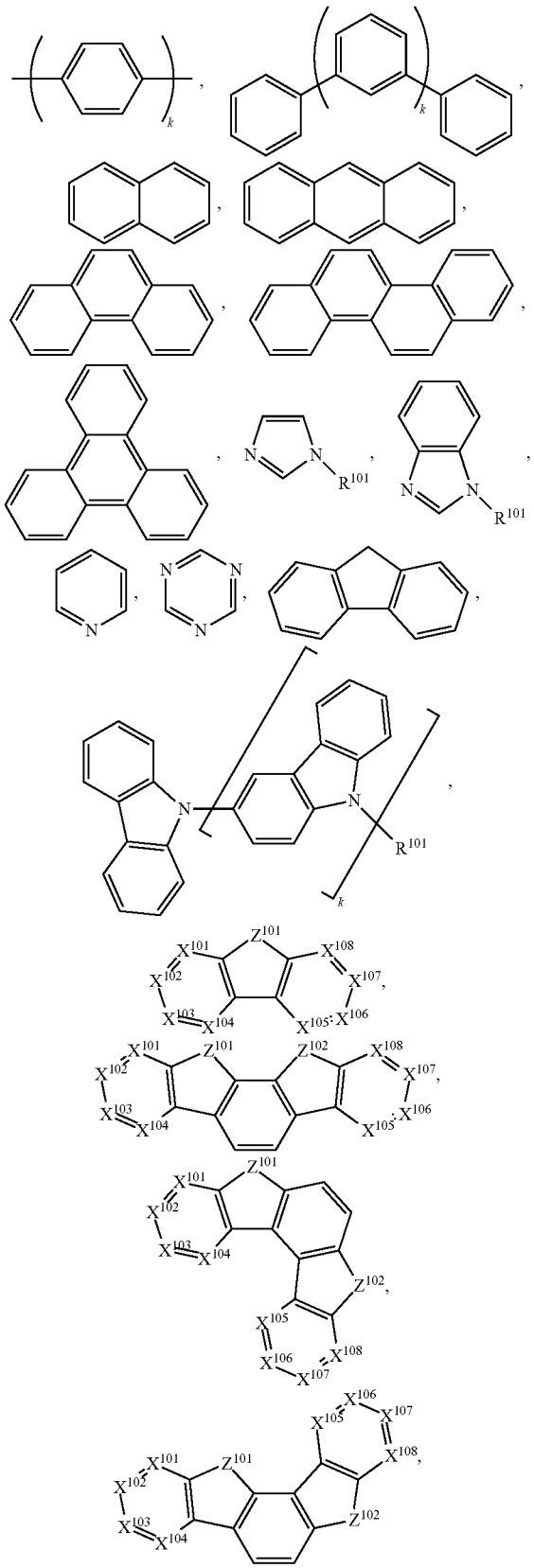

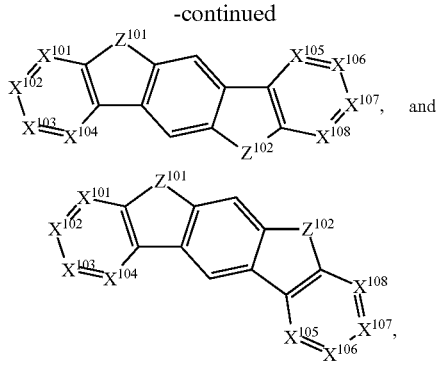

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803,

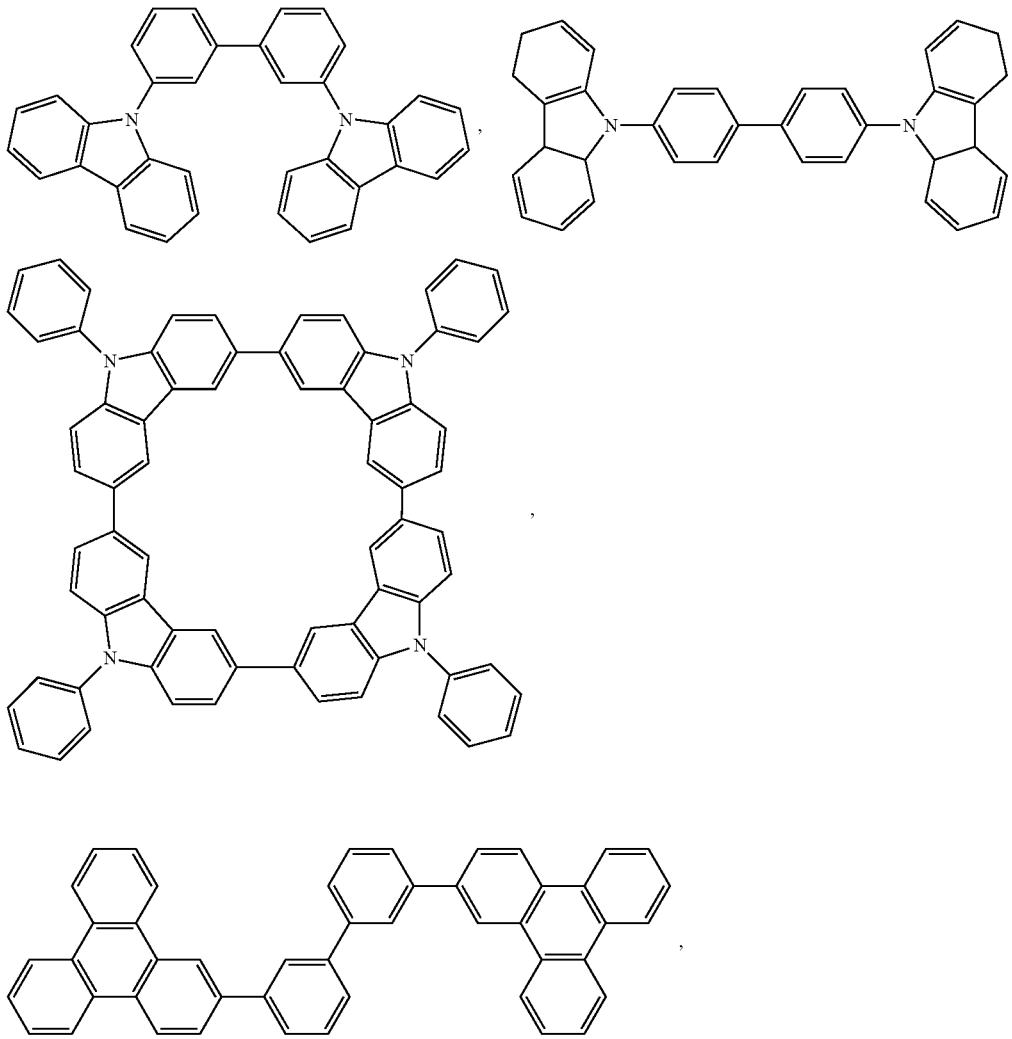

-continued
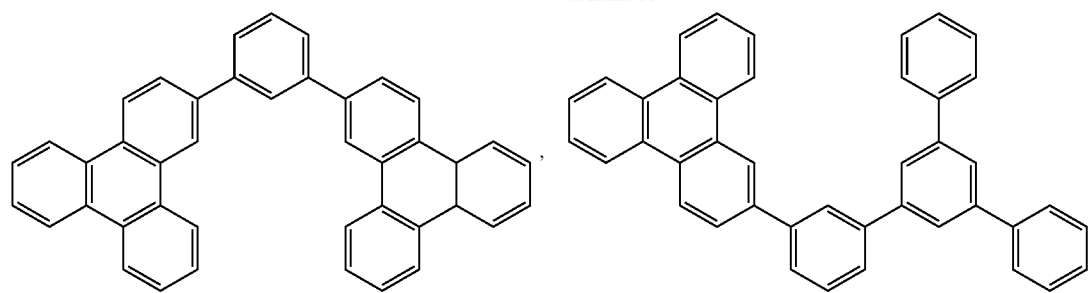
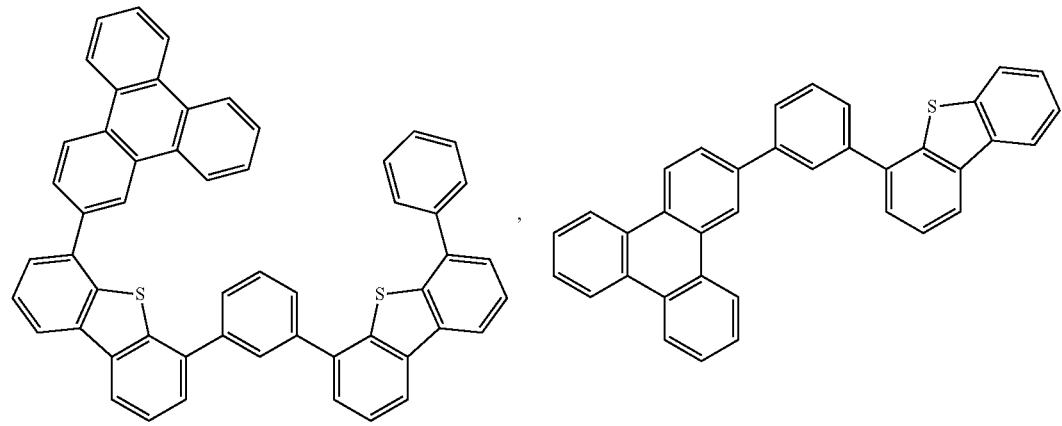
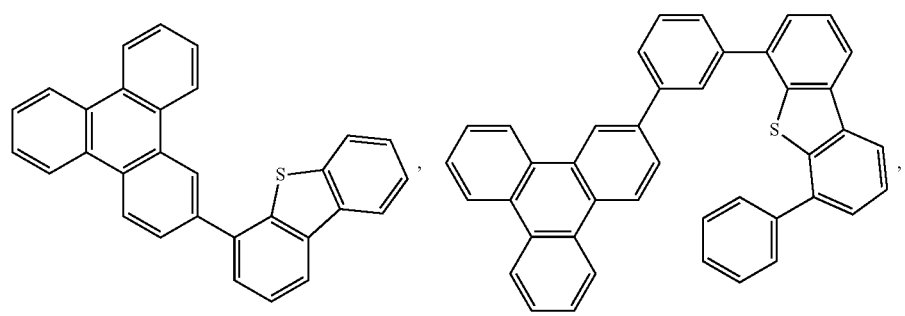
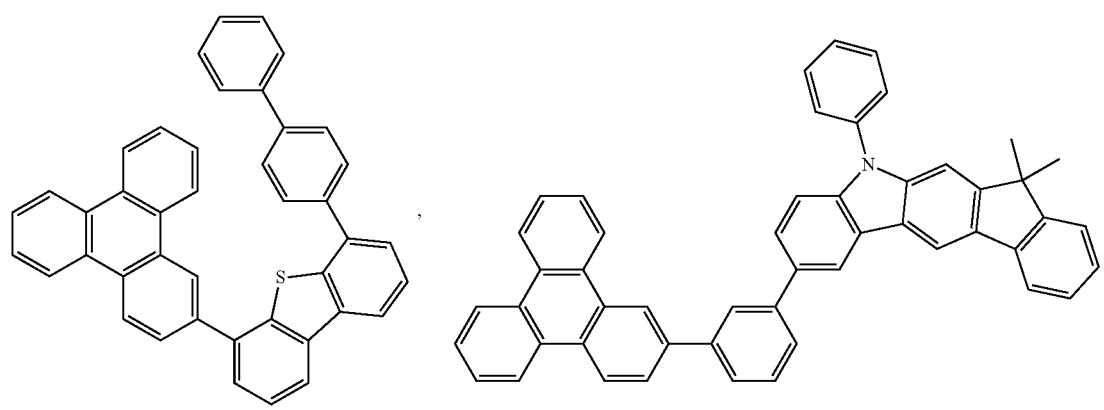

-continued
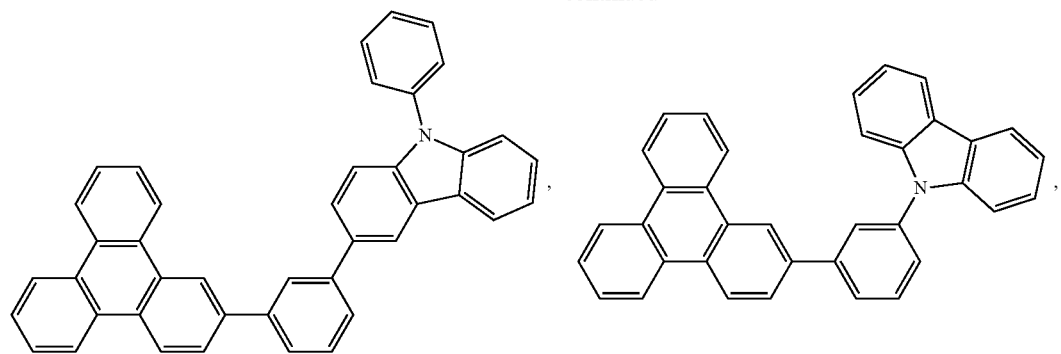
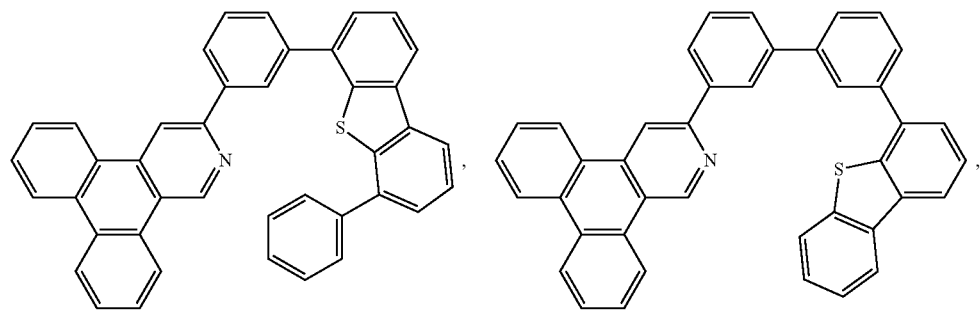
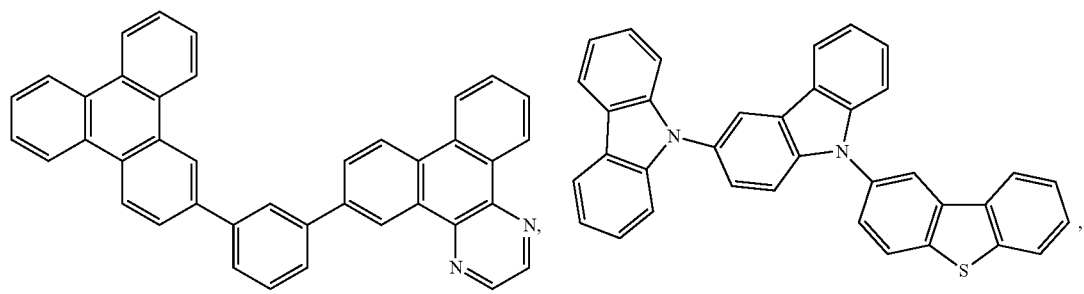
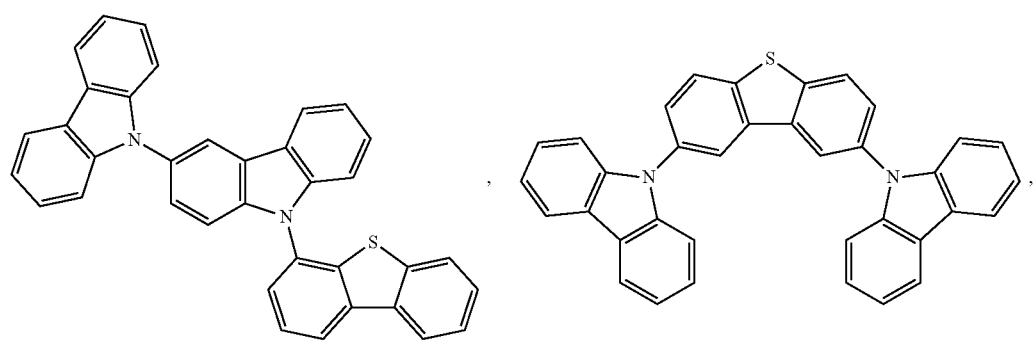
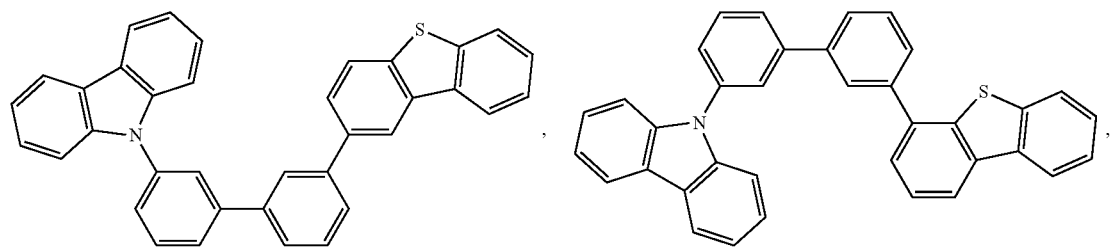

-continued
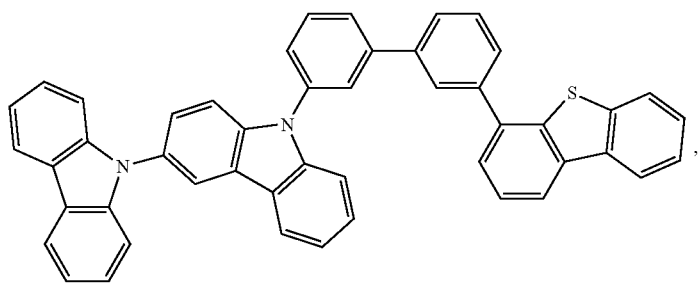,
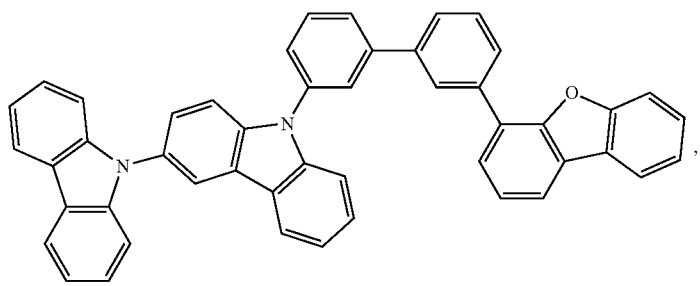,
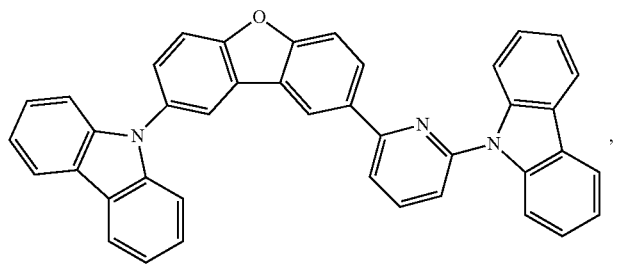,
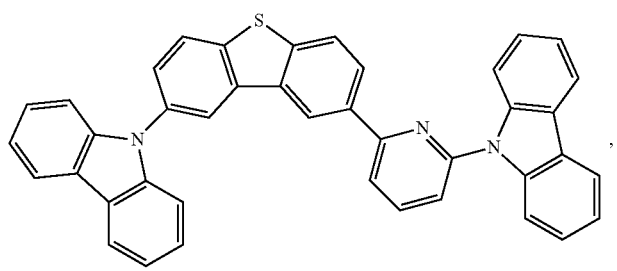,
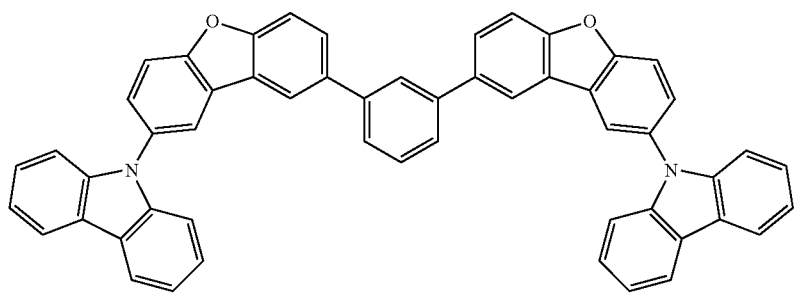,
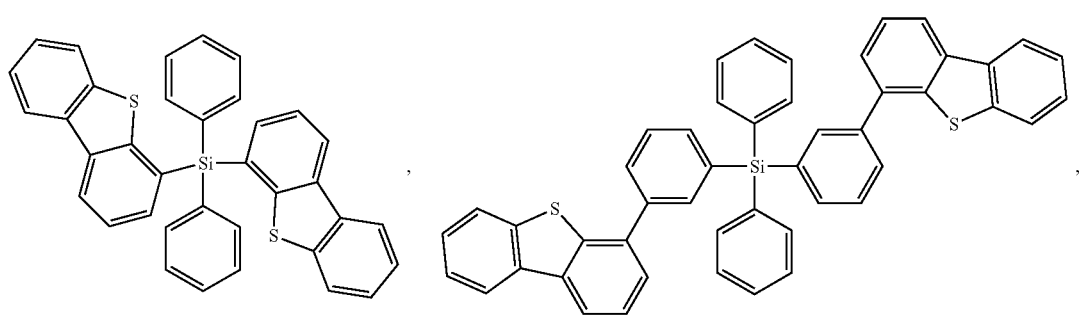, -continued
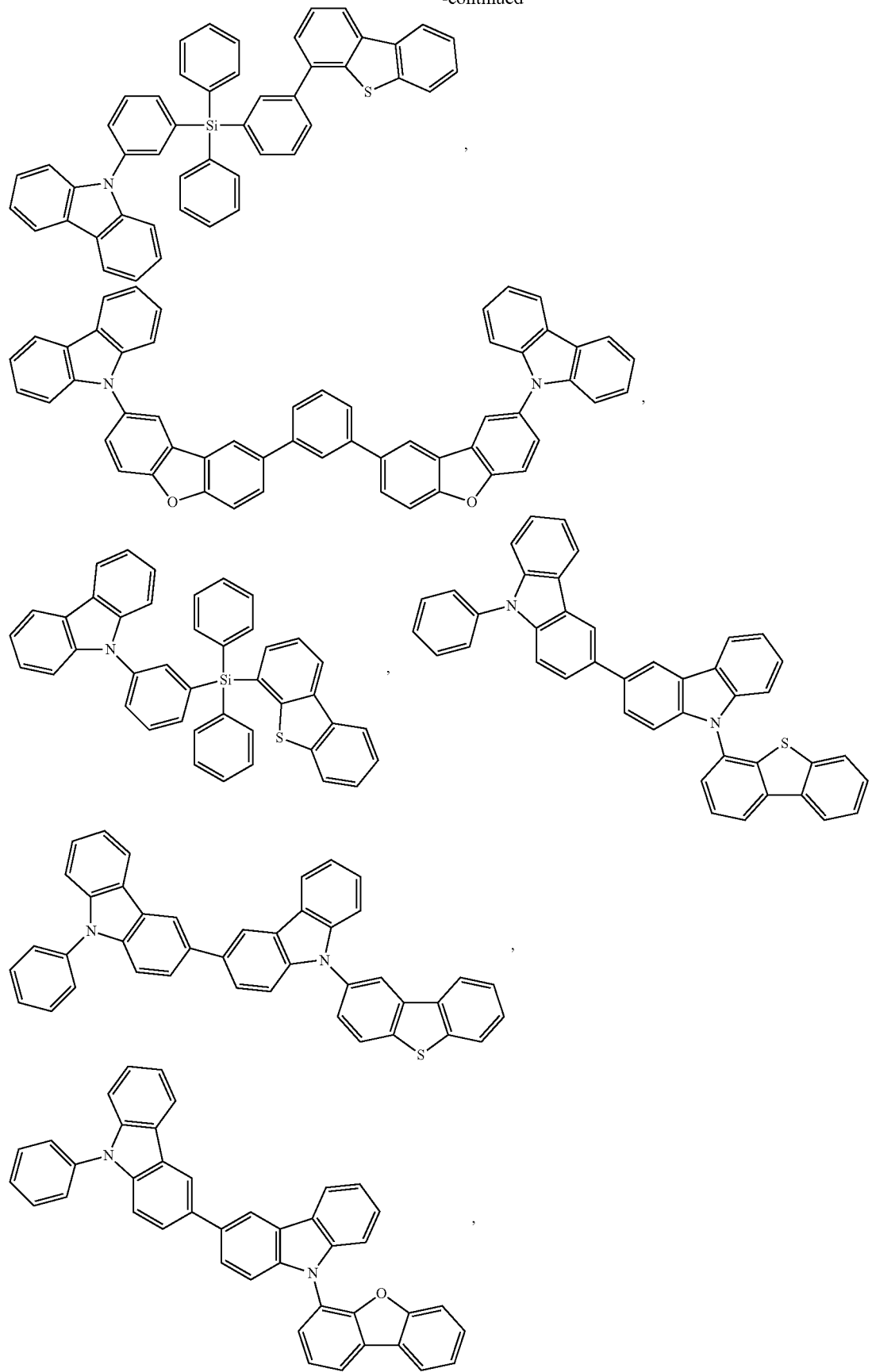

-continued
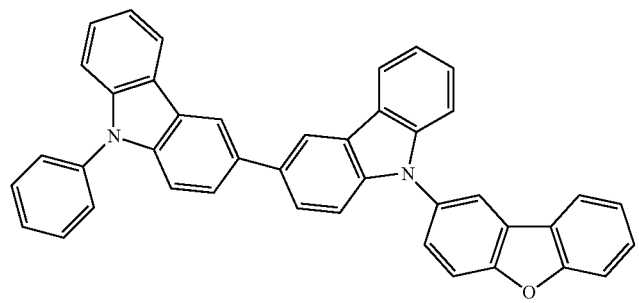
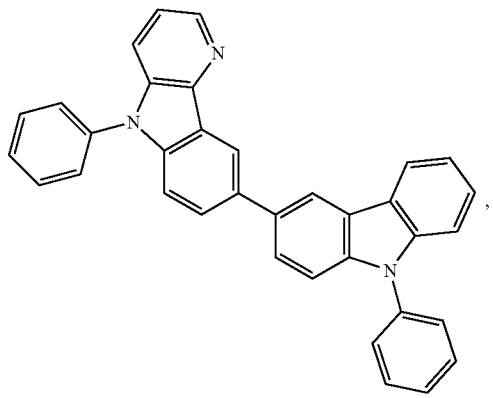
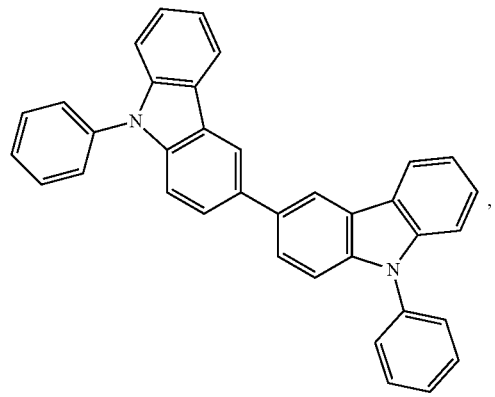
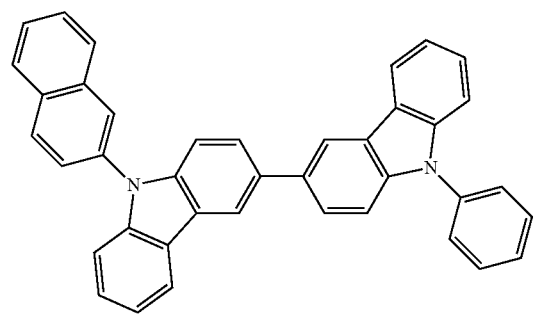
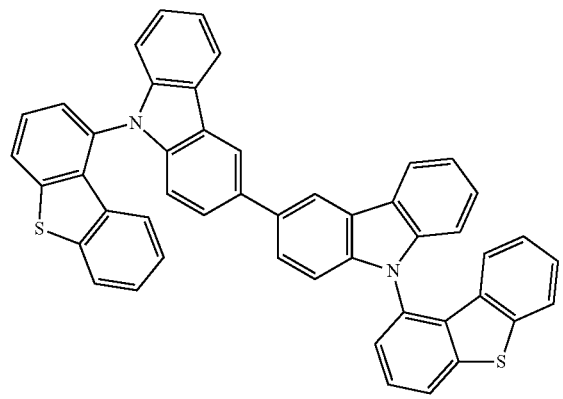
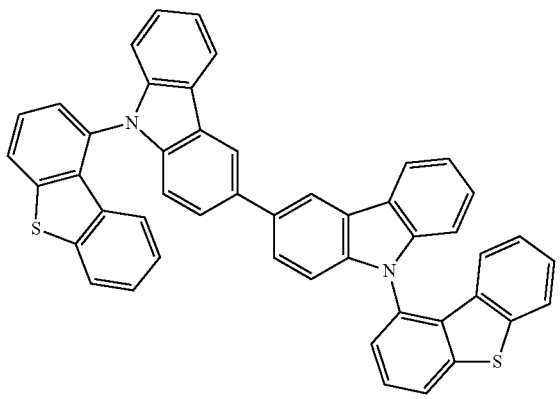
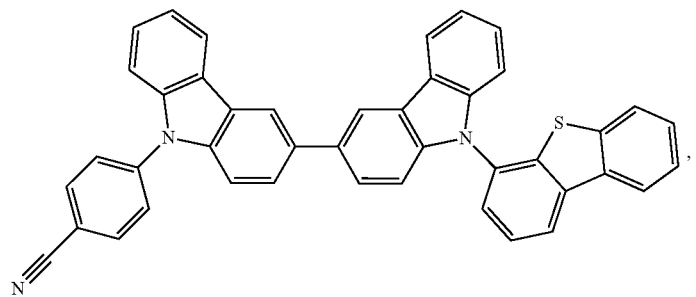

-continued
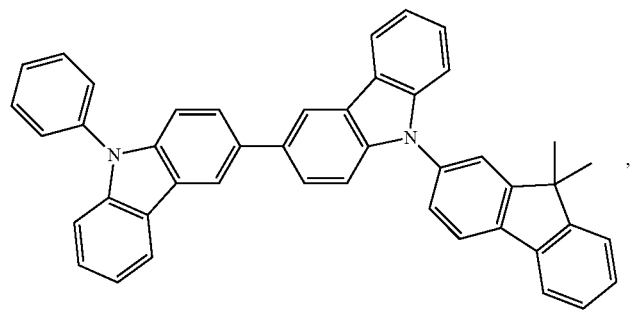
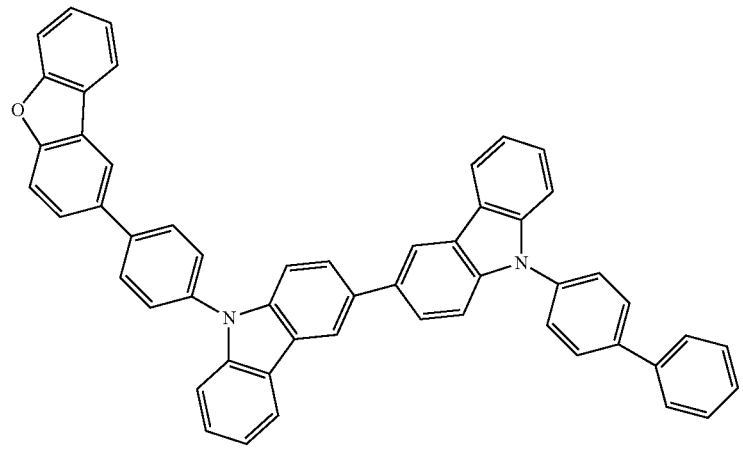
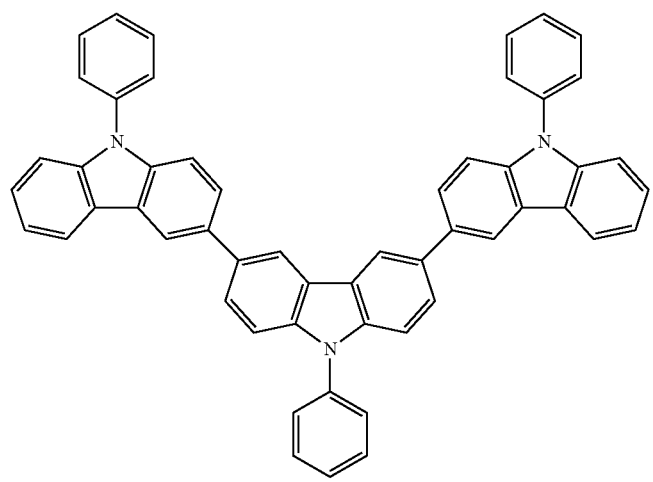
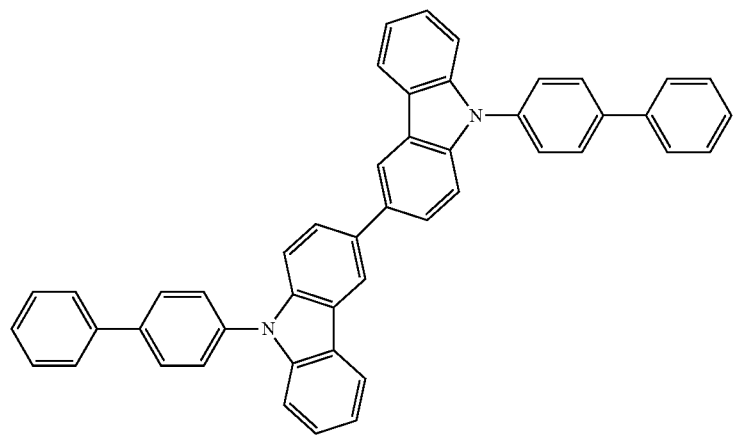

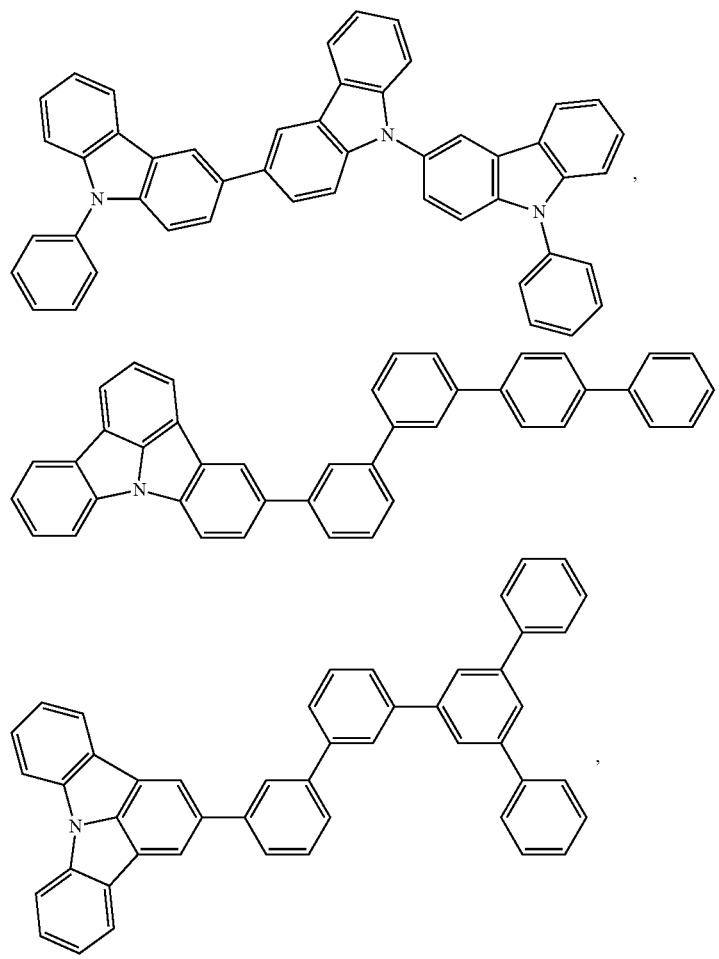
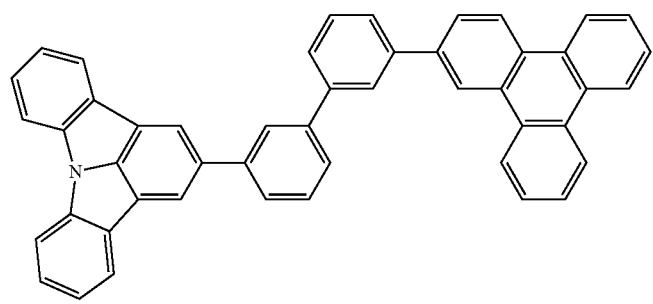
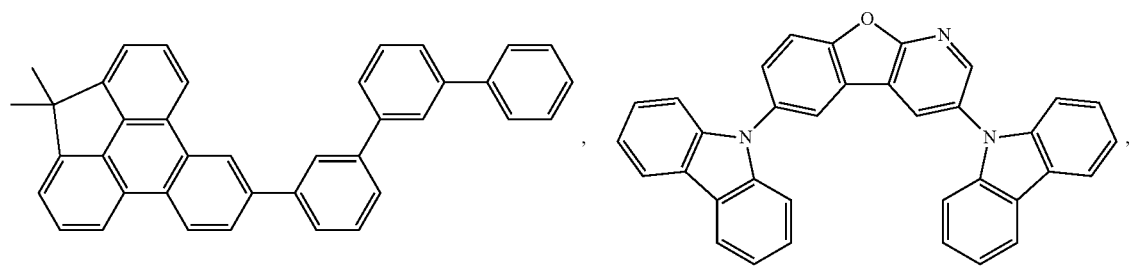

-continued
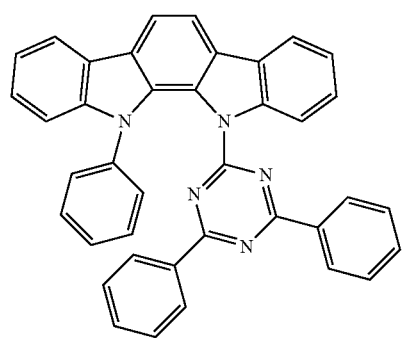 , 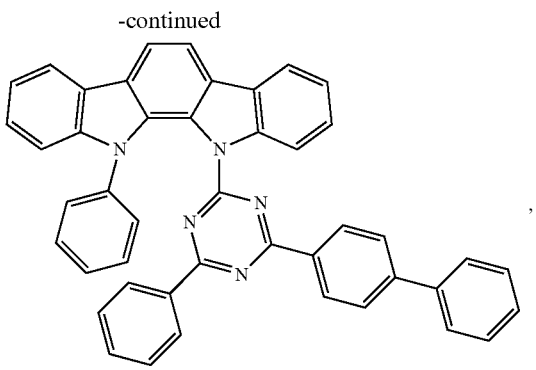 ,
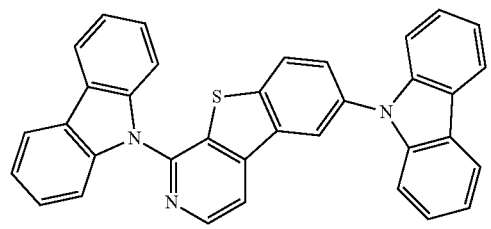 , 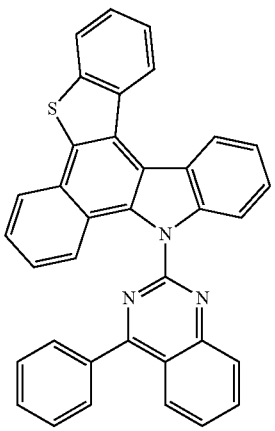 , 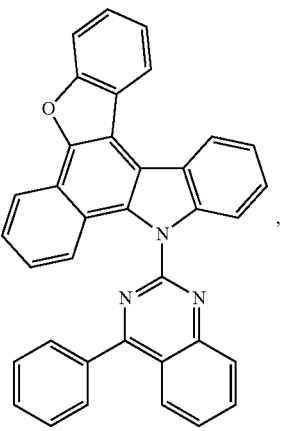 ,
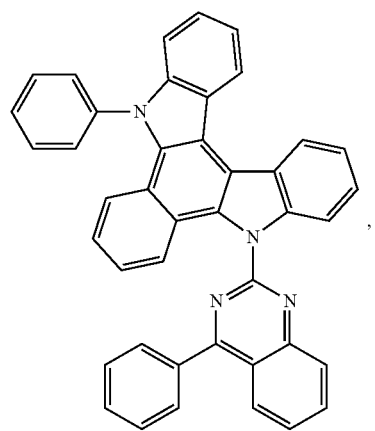 , 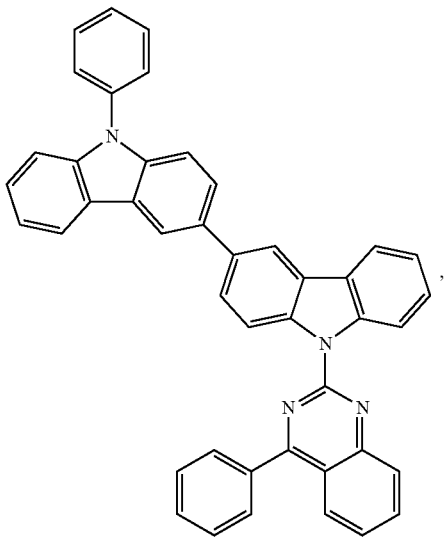 ,
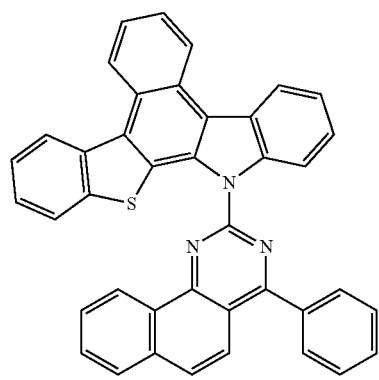 , 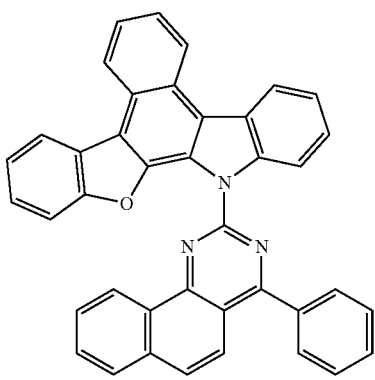 , -continued
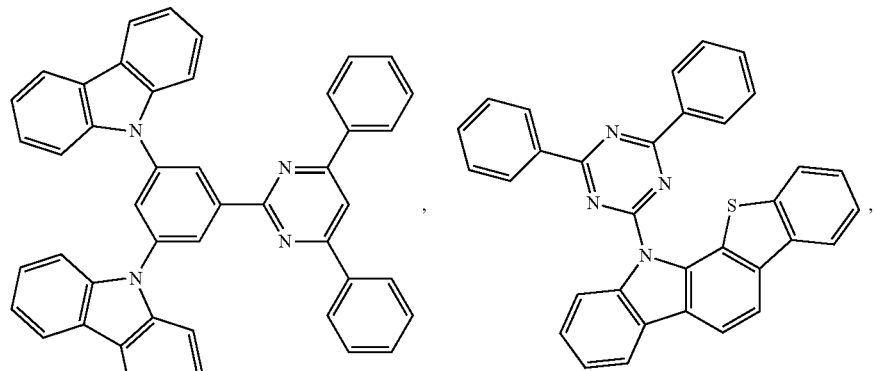
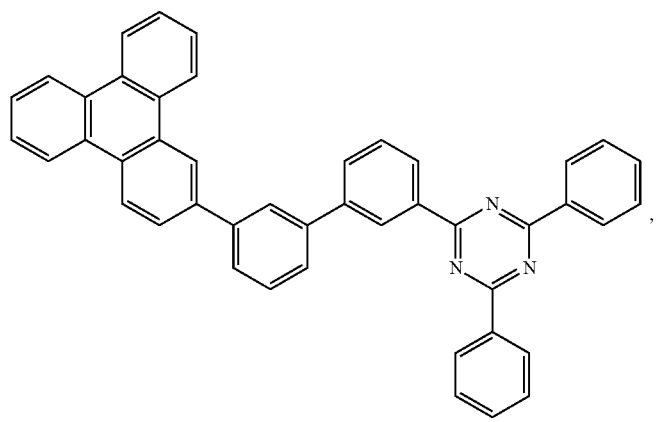
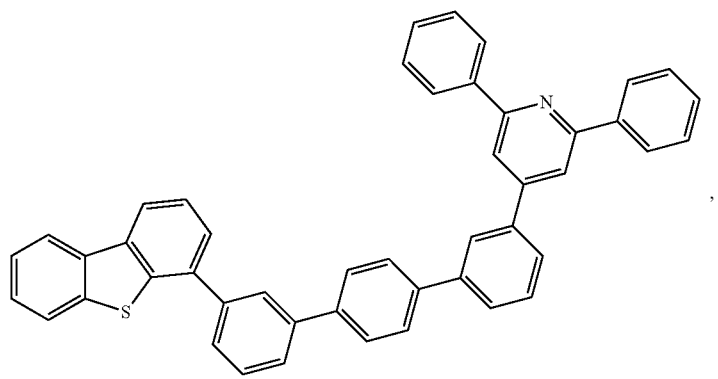
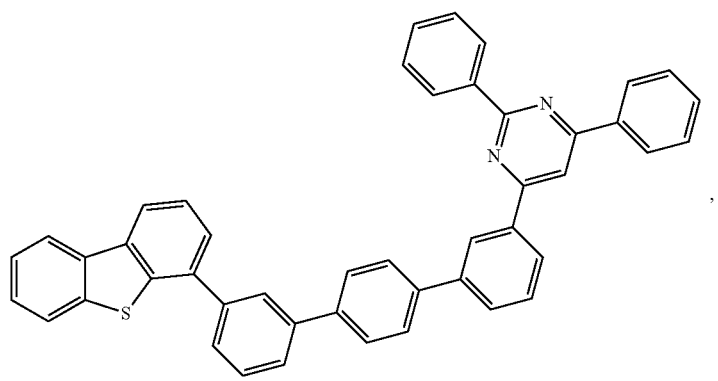

-continued
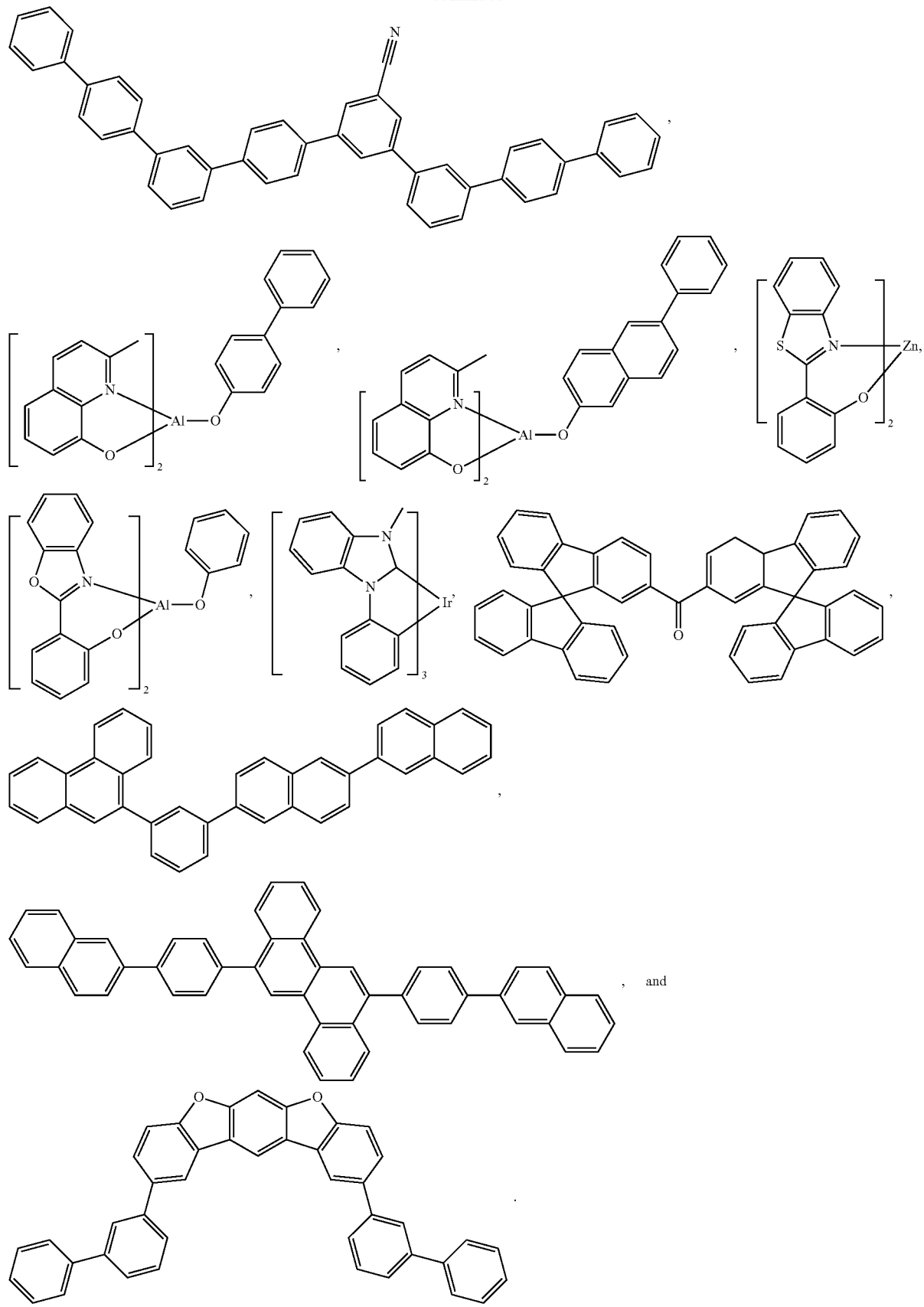

A host also may include a metal complex. The metal complex may include at least one of the following ligands:
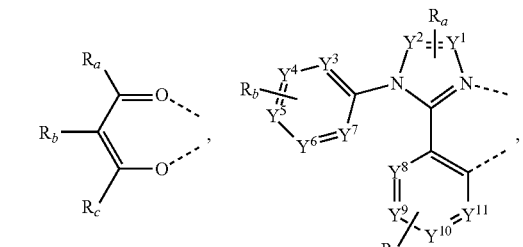
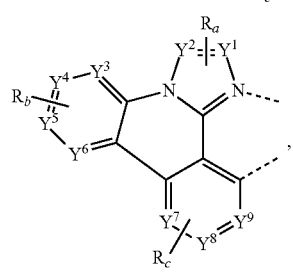
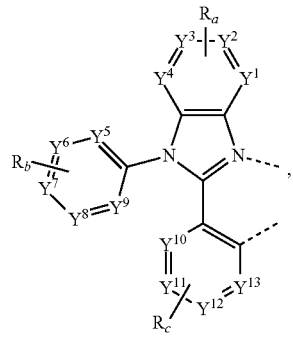
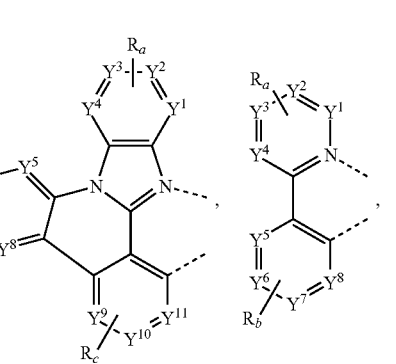
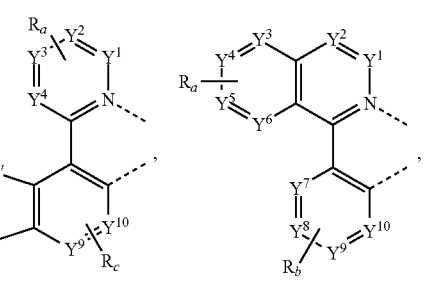
-continued
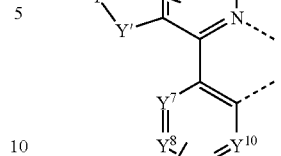
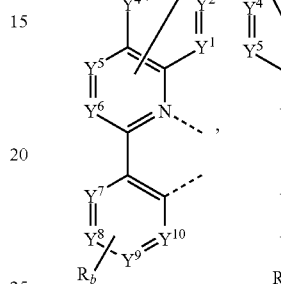
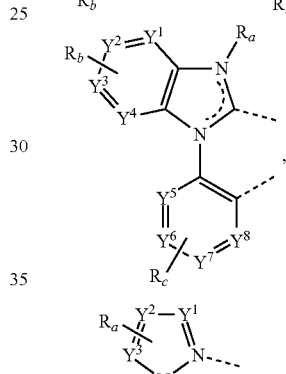
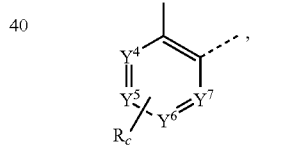
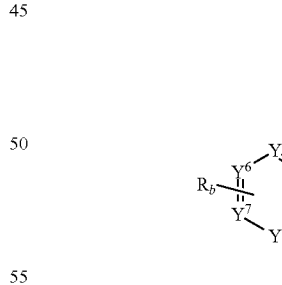
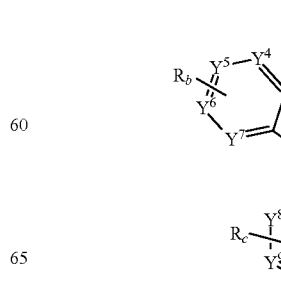
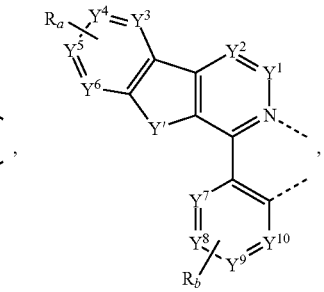
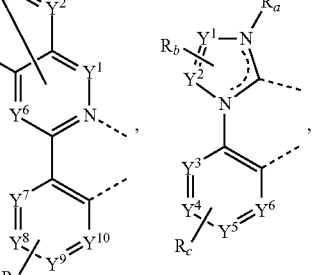
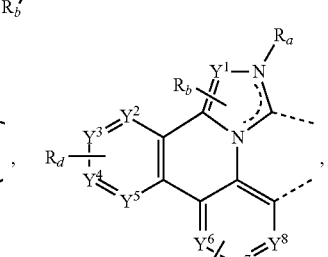
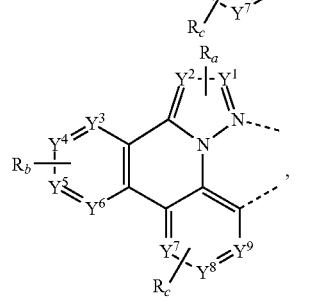
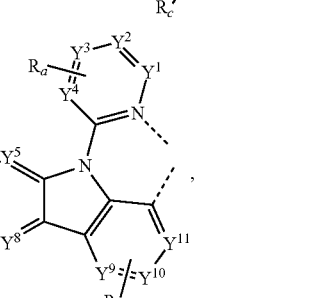
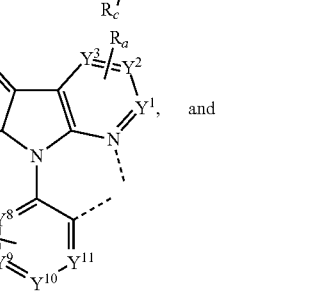
and

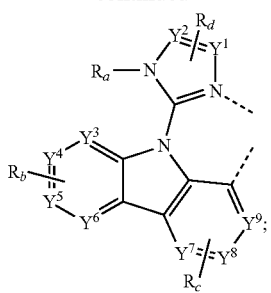

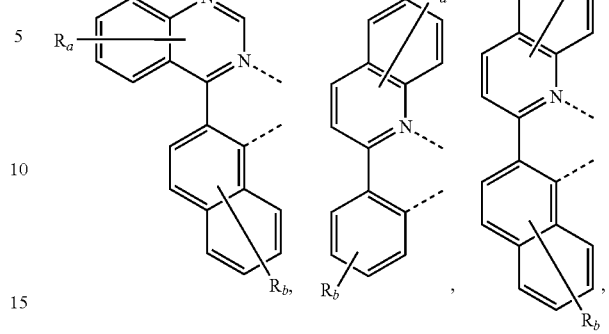

Where $Y^1$ to $Y^{13}$ are each independently selected from the group consisting of carbon and nitrogen; Y' is selected from the group consisting of $BR_e$, $NR_e$, $PR_e$, O, S, Se, C=O, S=O, $SO_2$, $CR_eR_f$, $SiR_eR_f$, and $GeR_eR_f$; wherein $R_e$ and $R_f$ are optionally fused or joined to form a ring; $R_a$, $R_b$, $R_c$, and $R_d$ each may independently represent zero, mono, or up to a maximum allowed substitution to its associated ring; each $R_a$, $R_b$, $R_c$, $R_d$, $R_e$ and $R_f$ are independently hydrogen or a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; and two adjacent substituents of $R_a$, $R_b$, $R_c$, and $R_d$ may be fused or joined to form a ring or form a multidentate ligand wherever chemically feasible.

The metal complex also may include at least one of the following ligands:

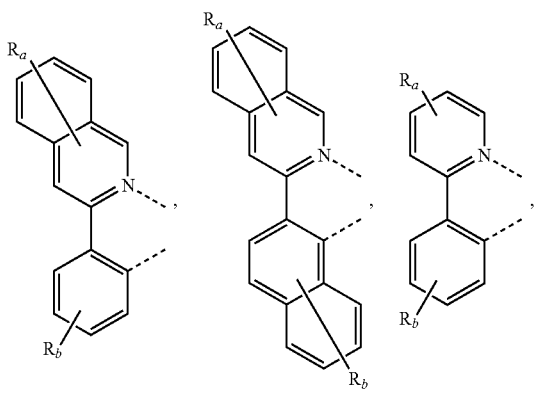

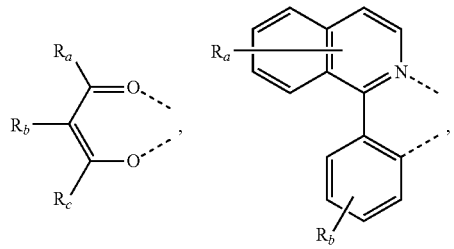

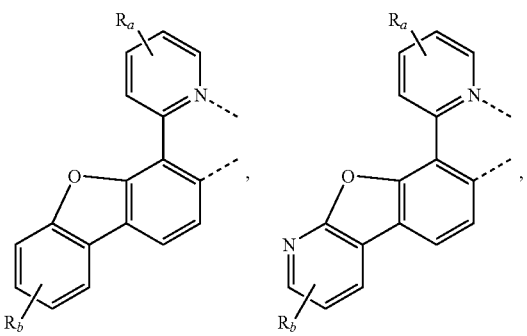

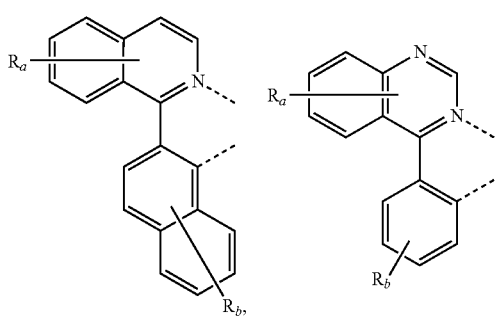

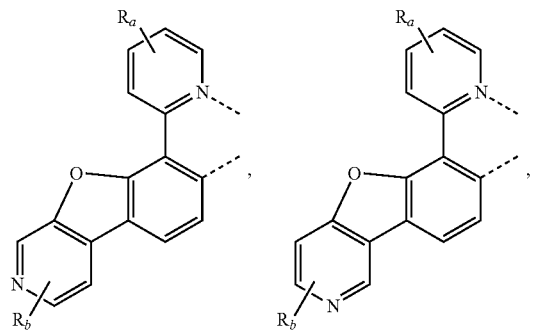

-continued
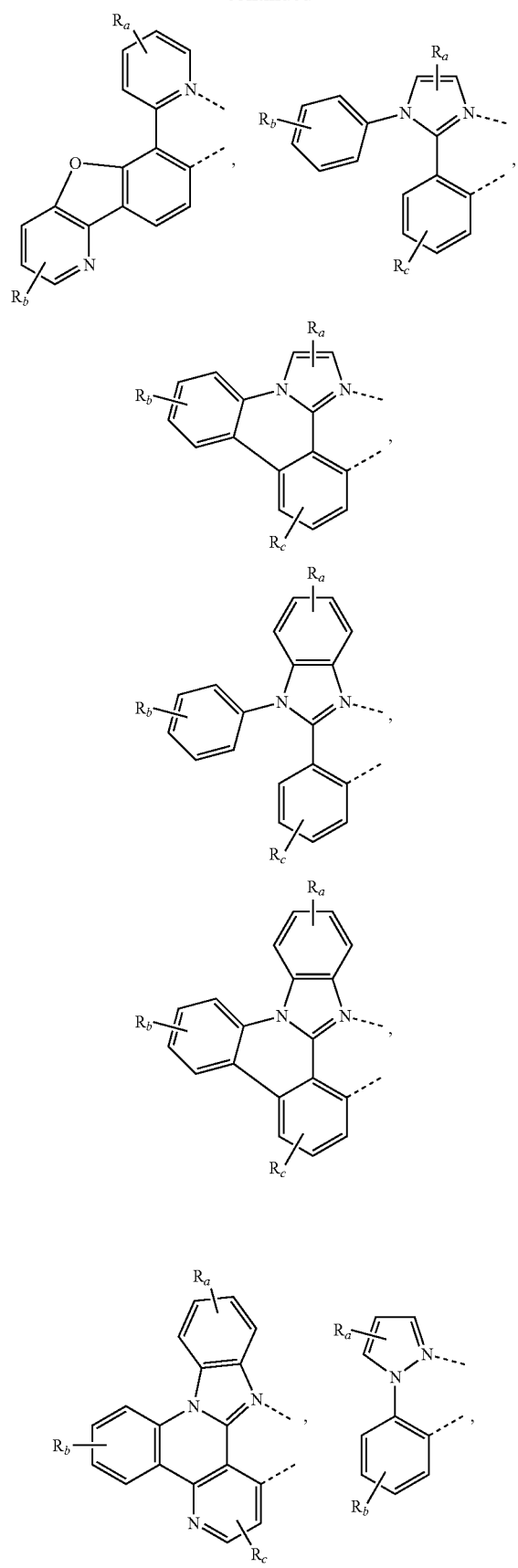
-continued
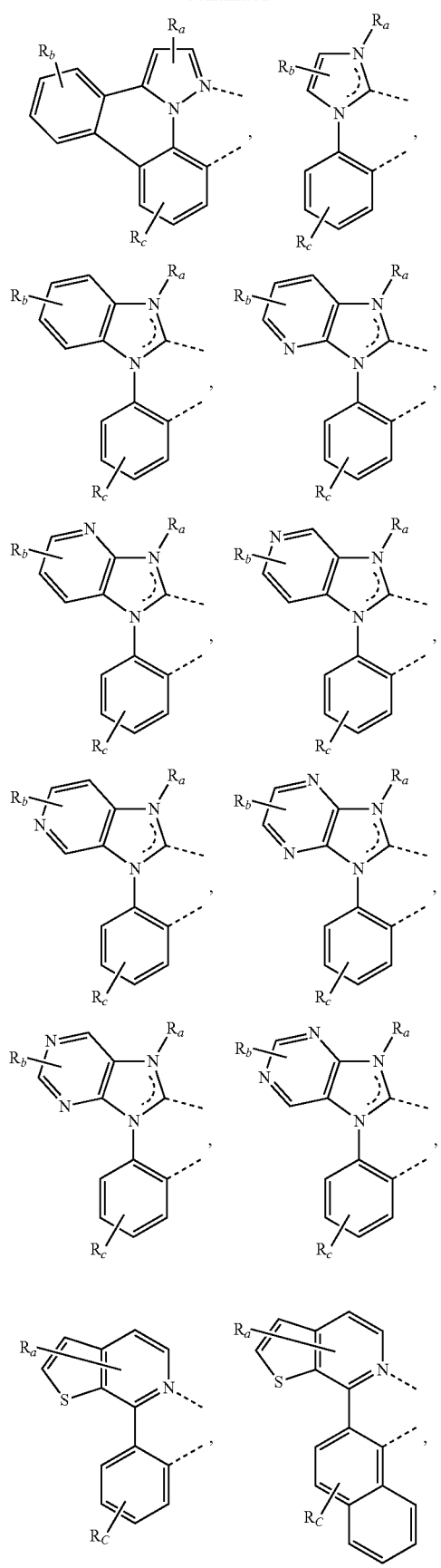

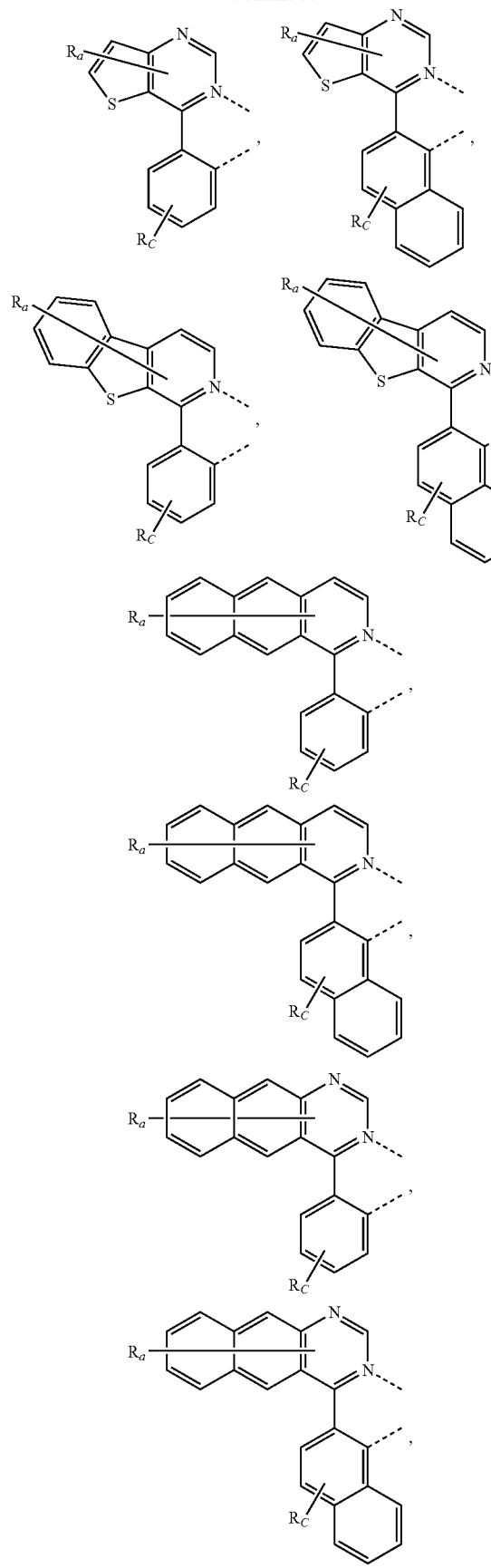
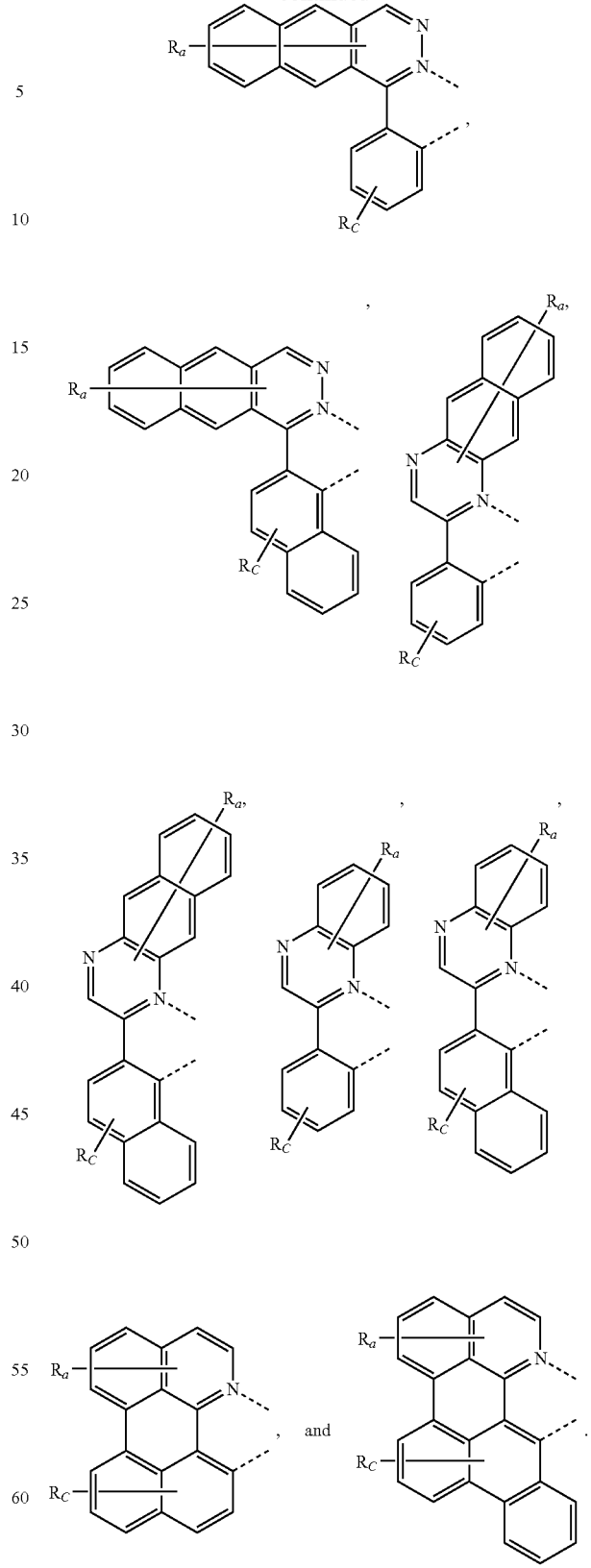
where $R_a$, $R_b$, and $R_c$ are all defined the same as above, and each of which may form a ring with the other wherever chemically feasible.

The host also may include one or more of the following:
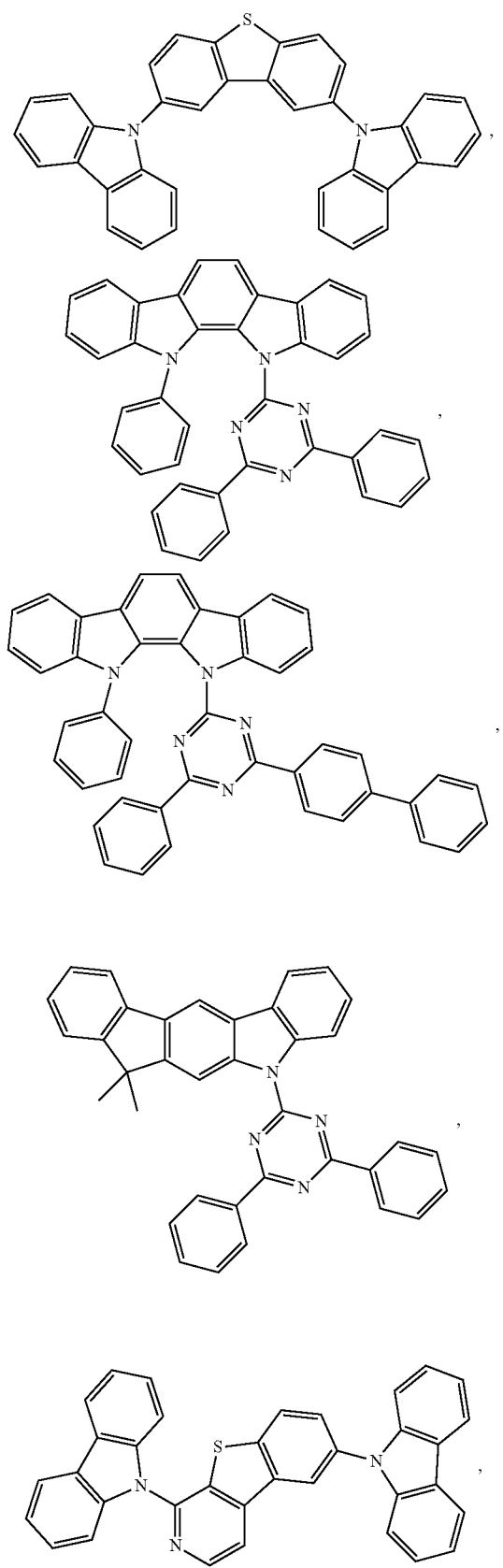
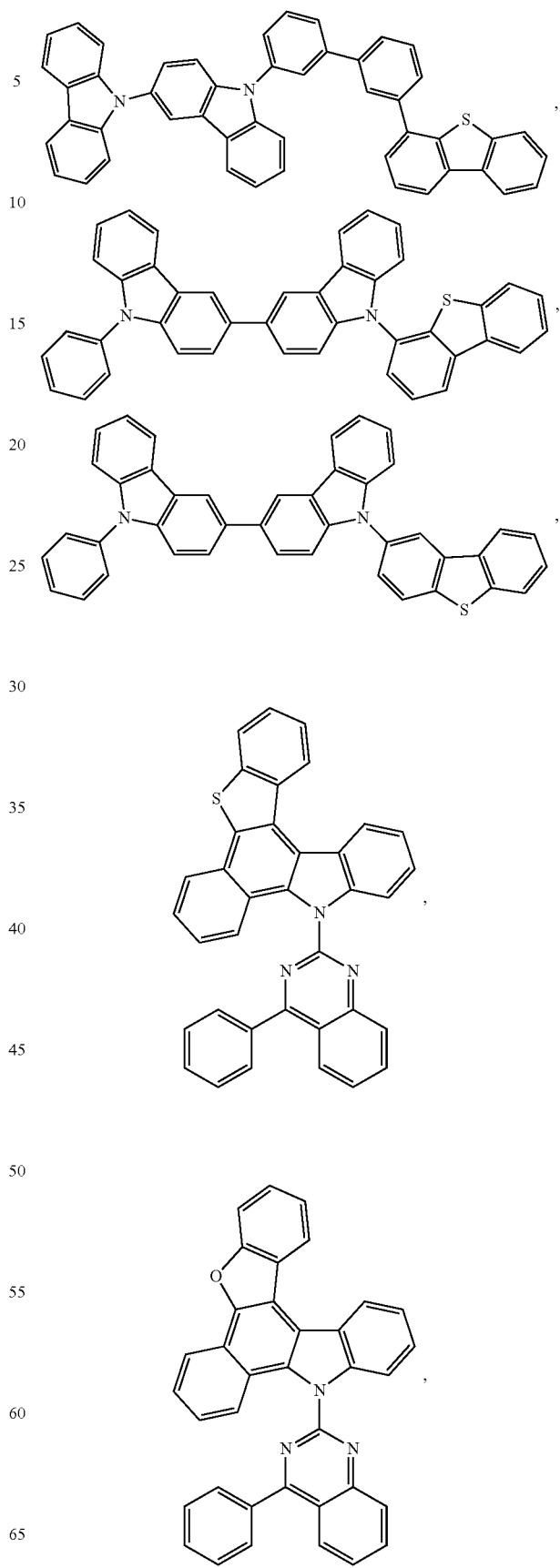

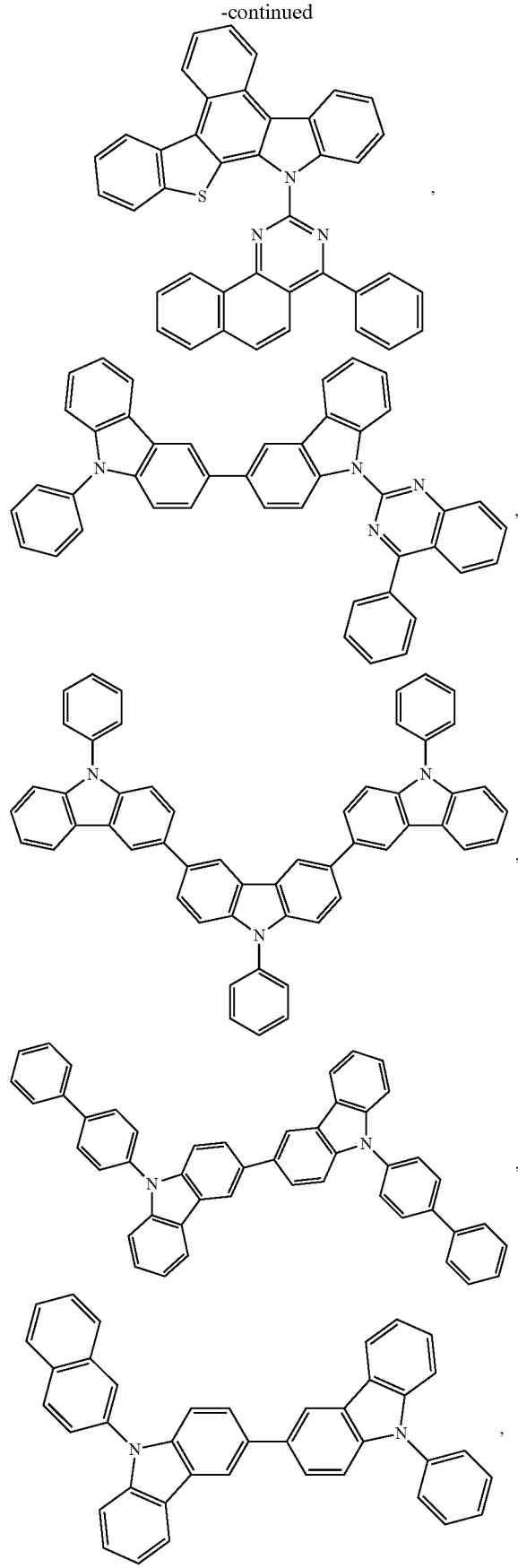
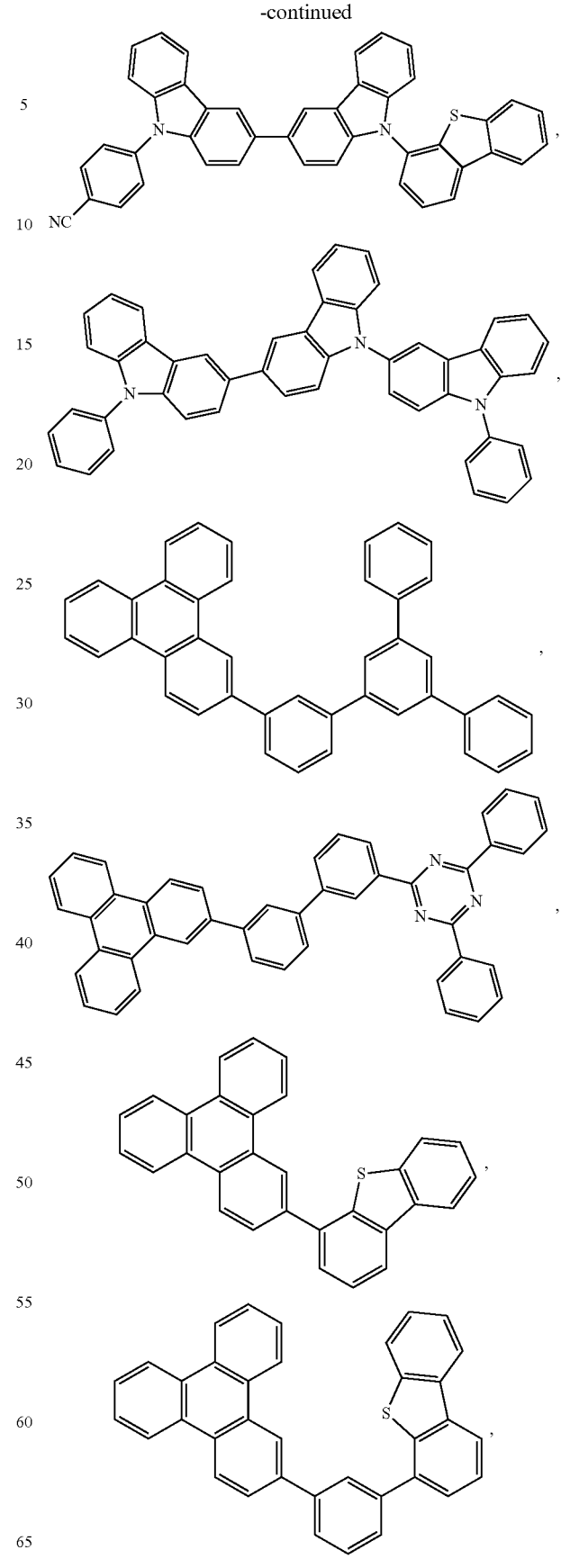

-continued

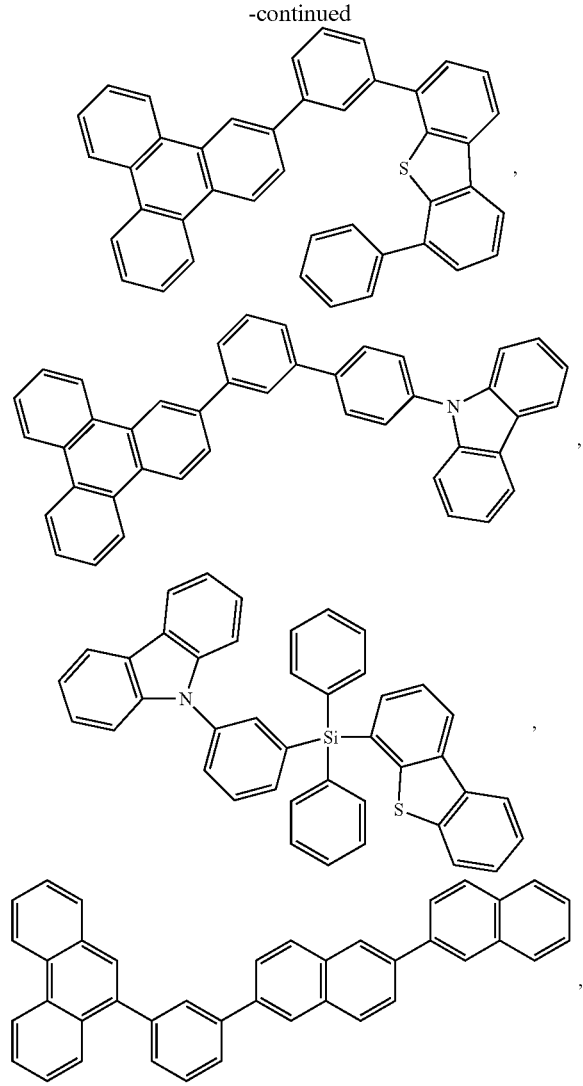

and combinations thereof.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

OLED devices that use phosphorescent emitters to enable emission from the triplet excited state typically demonstrate relatively long excited state lifetimes (transients) of 1 µs or more. According to the present disclosure, it has been found that the amount of time that an exciton resides on the emitter molecule is correlated to the overall device aging rate. Therefore, it is desirable to reduce the transient lifetime to achieving OLED devices with improved lifetimes.

One way to achieve a reduced transient is via the OLED device architecture by introducing an enhancement layer into the OLED stack, and locating the emitter within a threshold distance of the enhancement layer. As used herein, this threshold distance is defined as the distance from the enhancement layer at which the total radiative decay rate constant is equal to the total non-radiative decay rate constant. An emissive layer is considered to be within a threshold distance of the enhancement layer when at least a portion, up to and including the entirety, of the emissive layer not more than the threshold distance away from the enhancement layer, measured normal to the enhancement layer through the organic stack. When an emitter, such as the organic emissive materials and layers disclosed herein, is placed in an environment with an increased density of photonic states relative to vacuum, the emission rate of the emitter increases. This is known as the Purcell effect. This enhanced emissive and non-radiative rates decrease the length of time the emitter stays in the excited state, thereby stabilizing the emitter and reducing the aging rate of a device such as an OLED that incorporates the emitter. Some OLED architectures take advantage of this effect by using an enhancement layer having a plasmonic material that exhibits surface plasmon resonance that non-radiatively couples to an emissive material, thereby allowing for transfer of excited state energy from the emissive material to a non-radiative mode of surface plasmon polaritons. Such devices are described, for example, in U.S. Pat. No. 9,960,386, the disclosure of which is incorporated by reference in its entirety.

Hyperbolic metamaterials and plasmonic materials are well suited to enhancing the Purcell effect in an OLED as they have broadband photonic states. An increased radiative decay rate constant results in a lower exciton density within the emissive layer of the OLED device for a given current density relative to a device without the enhancement layer. This reduces loss mechanisms which rely on two particle collisions such as triplet-triplet annihilation and triplet-charge annihilation at high brightness, thus improving OLED performance at high brightness. An increase in the emission rate constant of the emitter will also reduce the average time the emitter spends in the excited state, reducing the total energy stored in the OLED for a given current density of operation. This, in turn, leads to a reduced rate at which the molecule ages into a non-luminescent species, resulting in a longer lifetime for the OLED device.

Figure 3:
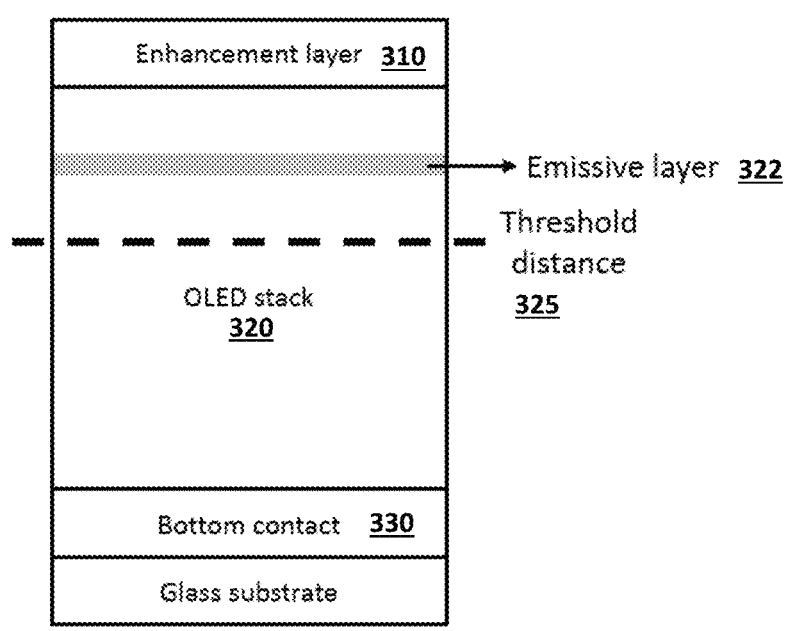
FIG. 3 shows an example device architecture as disclosed herein, in which at least a portion, up to and including the entirety of a phosphorescent emissive layer is placed within a threshold distance of an enhancement layer to reduce the transient excited state lifetime of the emitter to 200 ns or less and thus reduce the device aging rate.

An example of a general device structure that takes advantage of these effects to achieve a reduced transient is shown in FIG. 3. The device includes an OLED stack 320 disposed between two electrodes, such as described with respect to FIGS. 1 and 2. The device includes an enhancement layer 310 as described in U.S. Pat. No. 9,960,386, which may also be an electrode of the OLED stack 320 or may be a separate layer. A phosphorescent emissive layer 322 within the OLED stack is placed at or within a threshold distance 325 of the enhancement layer to enhance the Purcell effect. The enhancement layer 310 typically includes a plasmonic material that exhibits surface plasmon resonance, and the phosphorescent emitter 322 is disposed within a threshold distance of the enhancement layer 310 which is equal to the distance at which the total radiative decay rate constant of the phosphorescent emissive material is equal to the total non-radiative decay rate constant of the phosphorescent emissive material as previously disclosed. The plasmonic material in the enhancement layer non-radiatively couples to the phosphorescent emissive material and transfers excited state energy from the phosphorescent emissive material to a non-radiative mode of surface plasmon polaritons of the enhancement layer. As previously disclosed, the enhancement layer increases the density of states of the phosphorescent emissive material. This increase in states may occur specifically within a spectral range, which may be designed to overlap the emissive range of the phosphorescent emitter. Specifically, it may be desirable for the spectral range within which the density of states is increased to include a peak emission wavelength of the phosphorescent emitter. Device structures as disclosed and as shown in FIG. 3 may achieve phosphorescent transient lifetimes of 200 ns or less.

The enhancement layer may include one or more materials, such as those described in U.S. Pat. No. 9,960,386, including but not limited to Au, Ag, Mg, Al, Ir, Pt, Ni, Cu, W, Ta, Fe, Cr, Ga, Rh, Ti, Ca, Ru, Pd, In, Bi, a small organic molecule, a polymer, $SiO_2$, $TiO_2$, $Al_2O_3$, insulating nitrides, Si, Ge, and stacks or alloys thereof.

The resulting energy stored in the enhancement layer may be re-converted to light to regain device efficiency, but this is not necessary to achieve an increased OLED device stability as disclosed herein. More specifically, the constant-current-density lifetime of an OLED device as disclosed herein will increase due to a reduced transient excited state lifetime resulting from the architecture shown in FIG. 3. It has been found that there is a significant increase in device stability occurs for phosphorescent emitters whose transient lifetimes are reduced below 200 ns. For example, device lifetime increases of 20-fold or more (LT95) may be achieved. Further, it has been found that placing an emissive layer relatively close to an enhancement layer, such as within a threshold distance as disclosed herein, can achieve this excited state transient of not more than 200 ns. However, other techniques may be used to achieve such a transient which do not require an enhancement layer, such as the use of specific molecular structures as disclosed herein. The reduced transient of 200 ns or less also may be achieved for a triplet-emission emissive layer or material, as disclosed herein.

Figure 4:
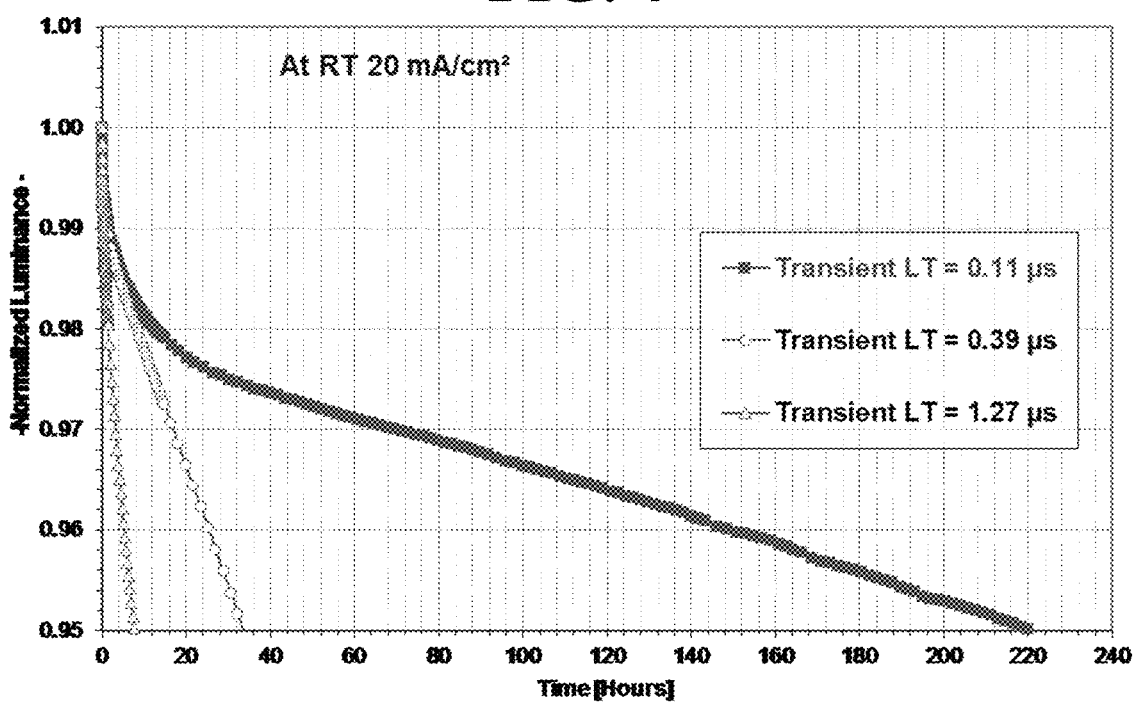
FIG. 4 shows the constant current density lifetime of three different OLED devices as disclosed herein, which incorporate the same emitter with a peak wavelength of about 475 nm, where each device is engineered such that their transient excited state lifetimes differ. For the device with transient less than 200 ns, there is a significant increase in LT95 of the device compared to the device exhibiting the ~1 μs transient lifetime typical of phosphorescent emitters.
Figure 5:
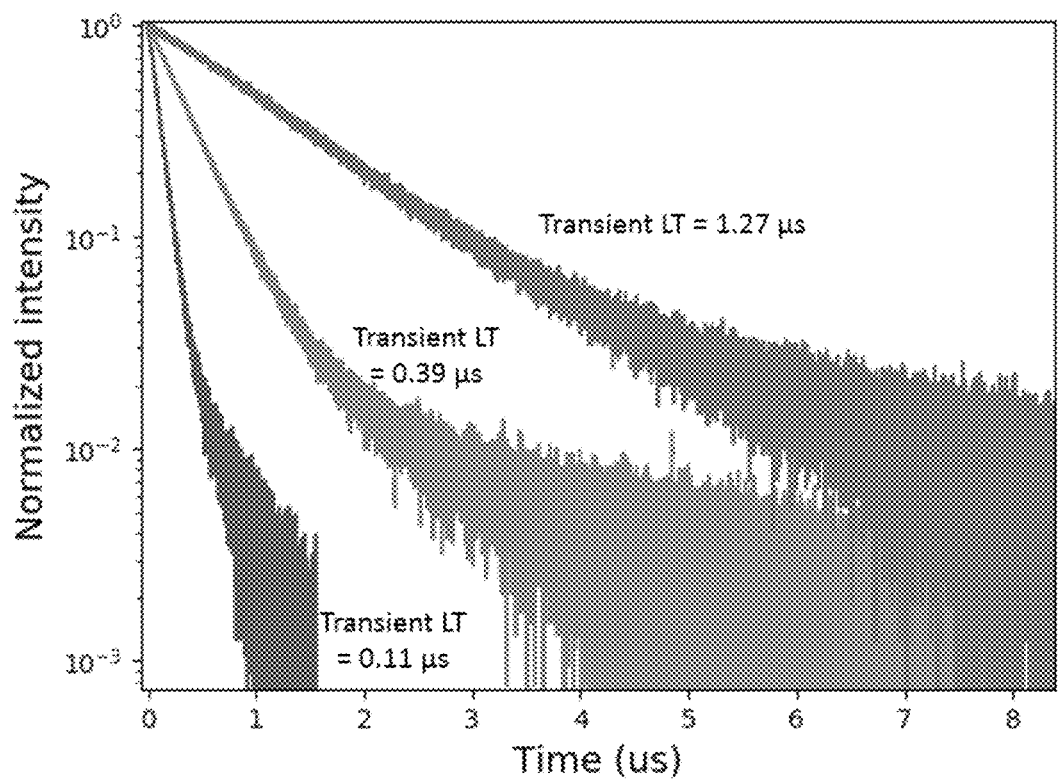
FIG. 5 is a plot of the electroluminescent (EL) transient lifetime for the three example devices of FIG. 3, demonstrating the variation in transient.
Figure 6:
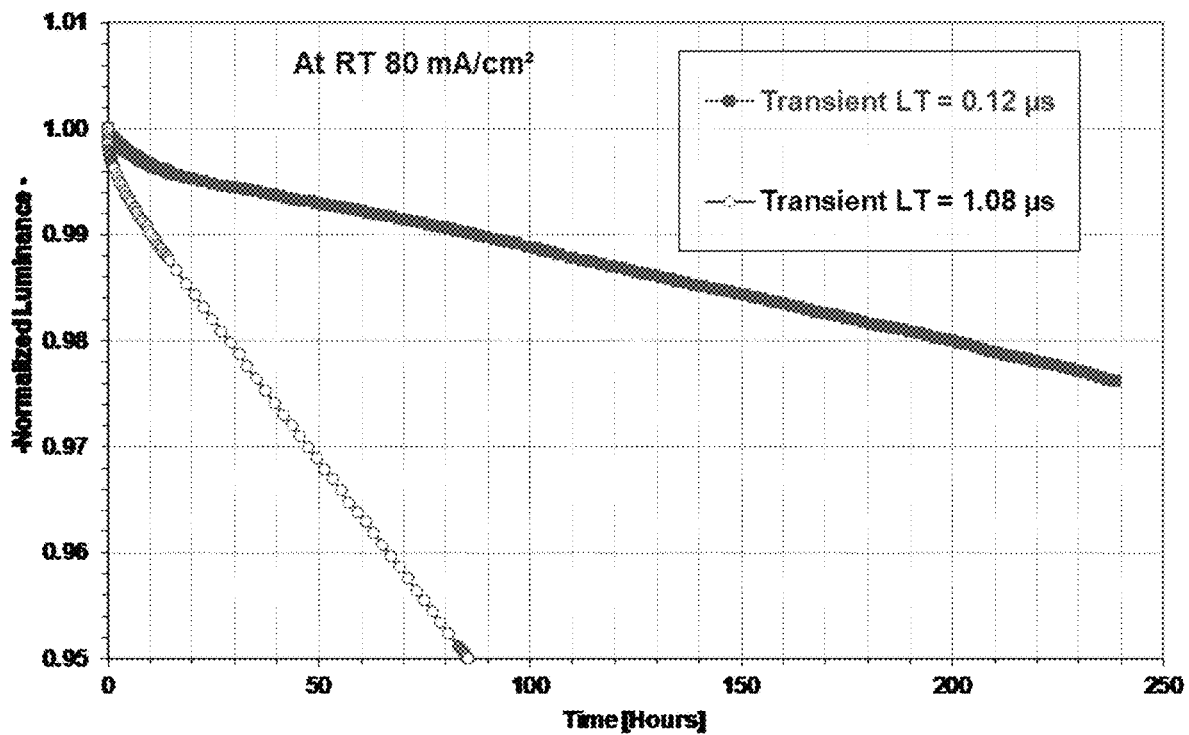
FIG. 6 shows the constant current density lifetime of three different OLED devices as disclosed herein, which incorporate the same emitter with a peak wavelength of about 525 nm, where each device is engineered such that their transient excited state lifetimes differ. For the device with transient less than 200 ns, there is a significant increase in LT95 of the device compared to the device exhibiting the ~1 μs transient lifetime typical of phosphorescent emitters.
Figure 7:
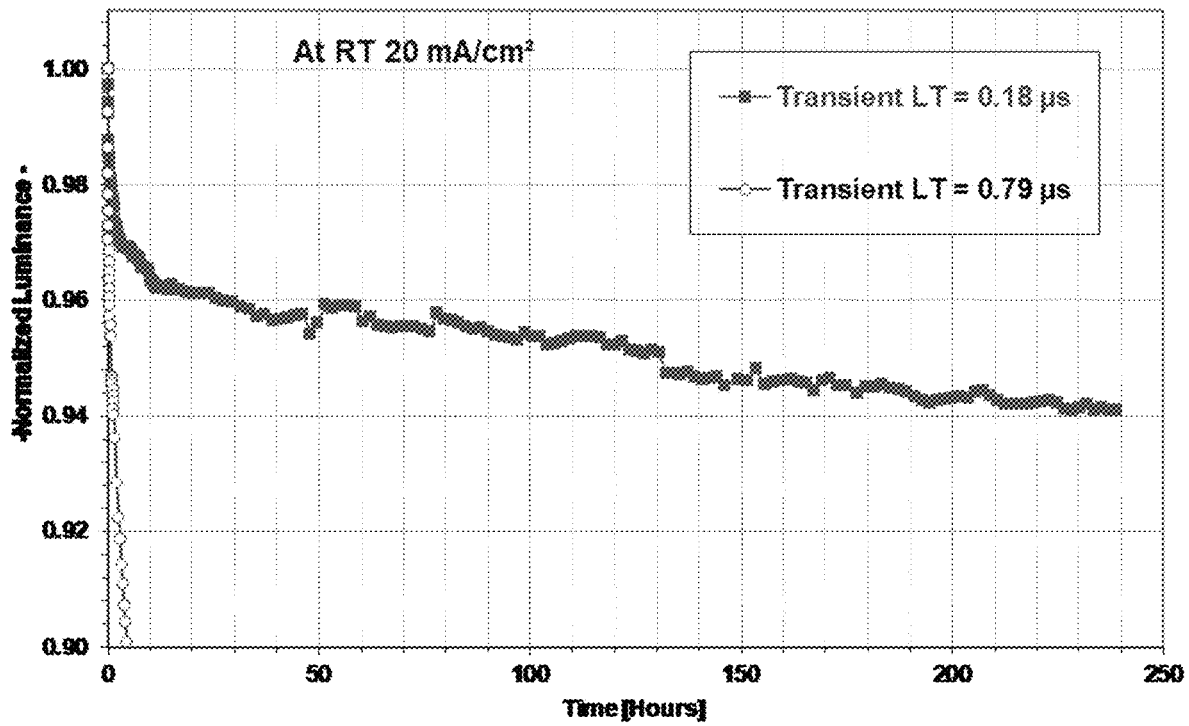
FIG. 7 shows the constant current density lifetime of three different OLED devices as disclosed herein, which incorporate the same emitter with a peak wavelength of about 465 nm, where each device is engineered such that their transient excited state lifetimes differ. For the device with transient less than 200 ns, there is a significant increase in LT95 of the device compared to the device exhibiting the ~1 μs transient lifetime typical of phosphorescent emitters.

The reduced transient lifetimes achievable with an architecture as shown in FIG. 3 are applicable to emitters across the wavelength spectrum, as shown in FIGS. 4-6. Specifically, FIG. 4 shows enhanced OLED stability for phosphorescent emitters with peak wavelengths of about 475 nm; FIG. 6 shows enhanced stability for phosphorescent emitters with peak wavelengths of about 525 nm; and FIG. 7 shows enhanced stability for phosphorescent emitters with peak wavelengths of about 465 nm. Furthermore, the EL transient measurements shown in FIG. 5 for a 475 nm-wavelength phosphorescent emitter demonstrate the sort of reduction in excited state lifetime that can be achieved through device engineering. More generally, the phosphorescent emitter may have an emission peak in the range 440-500 nm, 500-550 nm, 555-640 nm, or 640-1000 nm. In some cases, the emissive layer may include multiple phosphorescent emitters, each of which may have a different peak emission in a different range, or one or more of the emitters may have an emission peak in the same range.

A phosphorescent emissive material as disclosed herein may be an organic material. It may include a metal complex containing Ru, Os, Ir, Pd, Pt, Cu, Ag, Au, or combinations thereof. It may include a metal complex of the form

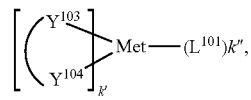

where Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In some cases the phosphorescent material may include a host and one or more dopants. Any material described herein as being suitable for use as a host may be used, including but not limited to an aromatic hydrocarbon cyclic compound; the group consisting of aromatic heterocyclic compounds; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group.

Other techniques may be used to speed up the transient decay of a phosphorescent emitter, alternatively or in conjunction with an arrangement as shown in FIG. 3. For example, the emitter molecule may be designed to minimize the decay time through mixing of states and spin orbit coupling could also result in fast decay times.

Alternatively or in addition, other structural components may be used to increase the efficiency of the device while maintaining a short transient. For example, an outcoupling layer may be used. In some cases an electrode or other layer may outcouple surface plasmons from the device. Such an outcoupling layer may include any known component or structure, including but not limited to nanoparticles, arrays of nanoparticles, or other structures such as a nanopatch antenna.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
   a first electrode;
   a second electrode;
   an emissive stack comprising a phosphorescent emissive material disposed between the first electrode and the second electrode;
   wherein a transient excited-state lifetime of the phosphorescent emissive material is not more than 200 ns.

2. The device of claim 1, further comprising:
   an enhancement layer comprising a plasmonic material exhibiting surface plasmon resonance.

3. The device of claim 2, wherein the phosphorescent emissive material is disposed within not more than a threshold distance of the enhancement layer.

4. The device of claim 3, wherein the threshold distance is equal to a distance from the enhancement layer at which the total radiative decay rate constant of the phosphorescent emissive material is equal to the total non-radiative decay rate constant of the phosphorescent emissive material.

5. The device of claim 2, wherein the enhancement layer increases the density of states of the organic emissive material within a first spectral range.

6. The device of claim 5, wherein the first spectral range comprises a peak emission wavelength of the phosphorescent emissive material.

7. The device of claim 2, wherein the first electrode or the second electrode comprises the enhancement layer.

8. The device of claim 2, wherein the plasmonic material in the enhancement layer non-radiatively couples to the phosphorescent emissive material and transfers excited state energy from the phosphorescent emissive material to a non-radiative mode of surface plasmon polaritons of the enhancement layer.

9. The device of claim 2, wherein the enhancement layer comprises a material selected from the group consisting of: Au, Ag, Mg, Al, Ir, Pt, Ni, Cu, W, Ta, Fe, Cr, Ga, Rh, Ti, Ca, Ru, Pd, In, Bi, a small organic molecule, a polymer, $SiO_2$, $TiO_2$, $Al_2O_3$, an insulating nitride, Si, Ge, and stacks or alloys thereof.

10. The device of claim 1, wherein the phosphorescent emissive material is an organic material.

11. The device of claim 10, wherein the phosphorescent material comprises a metal complex containing a metal selected from the group consisting of: Ru, Os, Ir, Pd, Pt, Cu, Ag, and Au.

12. The device of claim 1, further comprising an outcoupling layer disposed in a stack with the emissive stack.

13. The device of claim 12, wherein the first electrode or the second electrode acts as an outcoupling layer for surface plasmons.

14. The device of claim 12, wherein the outcoupling layer comprises nanoparticles.

15. The device of claim 1, wherein the phosphorescent emissive material has an emission peak in the range 440-500 nm.

16. The device of claim 1, wherein the phosphorescent emissive material has an emission peak in the range 500-550 nm.

17. The device of claim 1, wherein the phosphorescent emissive material has an emission peak in the range 555-640 nm.

18. The device of claim 1, wherein the phosphorescent emissive material has an emission peak in the range 640-1000 nm.

19. The device of claim 1, wherein the phosphorescent emissive material comprises a molecular structure that minimizes decay time through mixing of states and/or spin orbit coupling.

20. The device of claim 1, wherein the device is at least one type selected from the group consisting of: a flat panel display, a computer monitor, a medical monitor, a television, a billboard, a light for interior or exterior illumination and/or signaling, a heads-up display, a fully or partially transparent display, a flexible display, a laser printer, a telephone, a mobile phone, a tablet, a phablet, a personal digital assistant (PDA), a wearable device, a laptop computer, a digital camera, a camcorder, a viewfinder, a micro-display having an active area with a primary diagonal of 2 inches or less, a 3-D display, a virtual reality or augmented reality display, a vehicle, a video wall comprising multiple displays tiled together, a theater or stadium screen, and a sign.

* * * * *